(12) United States Patent
Kim

(10) Patent No.: US 12,356,695 B2
(45) Date of Patent: Jul. 8, 2025

(54) INTEGRATED CIRCUIT DEVICES

(71) Applicant: Samsung Electronics Co., Ltd., Suwon-si (KR)

(72) Inventor: Kijoon Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 396 days.

(21) Appl. No.: 17/903,159

(22) Filed: Sep. 6, 2022

(65) Prior Publication Data
US 2023/0078026 A1    Mar. 16, 2023

(30) Foreign Application Priority Data
Sep. 10, 2021 (KR) .................. 10-2021-0121170

(51) Int. Cl.
| | | |
|---|---|---|
| *H10D 64/27* | (2025.01) | |
| *H01L 21/02* | (2006.01) | |
| *H10B 12/00* | (2023.01) | |
| *H10D 62/80* | (2025.01) | |

(52) U.S. Cl.
CPC ..... *H10D 64/513* (2025.01); *H01L 21/02107* (2013.01); *H10B 12/053* (2023.02); *H10B 12/34* (2023.02); *H10B 12/488* (2023.02); *H10D 62/80* (2025.01)

(58) Field of Classification Search
CPC .......... H01L 21/02107; H10B 12/0383; H10B 12/0387; H10B 12/053; H10B 12/34; H10B 12/482; H10B 12/488; H10D 30/478; H10D 62/80; H10D 62/882; H10D 64/512; H10D 64/513
See application file for complete search history.

(56) References Cited

U.S. PATENT DOCUMENTS

| | | |
|---|---|---|
| 8,999,812 B2 | 4/2015 | Xianyu et al. |
| 9,040,957 B2 | 5/2015 | Lee et al. |
| 9,064,842 B2 | 6/2015 | Bol et al. |
| (Continued) | | |

FOREIGN PATENT DOCUMENTS

| | | |
|---|---|---|
| KR | 10-2013-0073712 A | 7/2013 |
| KR | 10-2020-0033025 A | 3/2020 |

OTHER PUBLICATIONS

Taiwanese Notice of Allowance dated Aug. 15, 2023 issued in Taiwanese Patent Application No. 111133711.
(Continued)

*Primary Examiner* — Brook Kebede
(74) *Attorney, Agent, or Firm* — Harness, Dickey & Pierce, P.L.C.

(57) ABSTRACT

An integrated circuit device including a substrate including a word line trench and a first recess adjacent to a first side wall portion of an inner wall of the word line trench, a channel region on the inner wall and extending in a first direction parallel to an upper surface of the substrate, the channel region including a first channel region in a portion of the substrate adjacent to the inner wall and a second channel region on the inner wall and including a two-dimensional (2D) material of a first conductivity type, a gate insulating layer on the second channel region, a word line on the gate insulating layer and inside the word line trench, and a source region in a first recess and including the 2D material of the first conductivity type may be provided.

20 Claims, 21 Drawing Sheets

(56) References Cited

U.S. PATENT DOCUMENTS

| | | |
|---|---|---|
| 9,240,478 B2 | 1/2016 | Chang et al. |
| 9,337,149 B2 | 5/2016 | Im et al. |
| 9,455,256 B2 | 9/2016 | Heo et al. |
| 10,529,835 B2 | 1/2020 | Koh et al. |
| 10,593,763 B2 | 3/2020 | Colombo et al. |
| 10,991,807 B2 | 4/2021 | Nam |
| 2012/0187475 A1* | 7/2012 | Yamazaki .............. H10B 41/70 257/330 |
| 2016/0329313 A1 | 11/2016 | Kawa et al. |
| 2022/0077154 A1* | 3/2022 | Kim .................... H10B 12/315 |

OTHER PUBLICATIONS

Korean Notice of Allowance dated May 21, 2025 issued in Korean Patent Application No. 10-2021-0121170.

\* cited by examiner

B-B'

B-B'

A-A'

A-A'

A-A'

INTEGRATED CIRCUIT DEVICES

CROSS-REFERENCE TO RELATED APPLICATION

This application is based on and claims priority under 35 U.S.C. § 119 to Korean Patent Application No. 10-2021-0121170, filed on Sep. 10, 2021, in the Korean Intellectual Property Office, the disclosure of which is incorporated by reference herein in its entirety.

BACKGROUND

The inventive concepts relate to integrated circuit devices, and more particularly, to integrated circuit devices with a buried channel transistor.

As integrated circuit devices are downscaled, the sizes of individual fine circuit patterns for implementing integrated circuit devices are becoming more and more reduced. In addition, the demand for integrated circuit devices that can be driven with low power to be used in various applications, including Internet-of-things (IoT), artificial intelligence (AI) storage devices, etc., is increasing.

SUMMARY

The inventive concepts provide integrated circuit devices capable of reducing power consumption.

According to an aspect of the inventive concepts, an integrated circuit device includes a substrate including a word line trench and a first recess adjacent to a first side wall portion of an inner wall of the word line trench, a channel region on the inner wall of the word line trench, the channel region extending in a first direction parallel to an upper surface of the substrate, the channel region including a first channel region and a second channel region, the first channel region being in a portion of the substrate that is adjacent to the inner wall of the word line trench, the second channel region on the inner wall of the word line trench and including a two-dimensional (2D) material of a first conductivity type, a gate insulating layer on the second channel region, a word line on the gate insulating layer and inside the word line trench, and a source region in the first recess and including the 2D material of the first conductivity type.

According to another aspect of the inventive concepts, an integrated circuit device includes substrate including a word line trench and a first recess adjacent to a first side wall portion of an inner wall of the word line trench, a channel region on the inner wall of the word line trench and extending in a first direction parallel to an upper surface of the substrate, the channel region including a two-dimensional (2D) material of a first conductivity type, a gate insulating layer on the channel region, a word line on the gate insulating layer and inside the word line trench, and a source region in a first recess, including the 2D material of the first conductivity type, and connected to the channel region.

According to another aspect of the inventive concepts, an integrated circuit device includes a substrate including a word line trench, a first recess adjacent to a first side wall portion of an inner wall of the word line trench, and a second recess adjacent to a second side wall portion of the word line trench, the second side wall portion being opposite to the first side wall portion, a channel region on the inner wall of the word line trench and extending in a first direction parallel to an upper surface of the substrate, the channel region including a first channel region and a second channel region, the first channel region in a portion of the substrate that is adjacent to the inner wall of the word line trench, the second channel region on the inner wall of the word line trench and including a two-dimensional (2D) material of a first conductivity type, a word line on the inner wall of the word line trench and extending in the first direction, a source region in the first recess and including a two-dimensional (2D) material of the first conductivity type, a bit line on the source region and extending in a second direction parallel to the upper surface of the substrate and perpendicular to the first direction, and a drain region in the second recess.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Expressions such as "at least one of," when preceding a list of elements, modify the entire list of elements and do not modify the individual elements of the list. Thus, for example, both "at least one of A, B, or C" and "A, B, and C" means either A, B, C or any combination thereof.

Figure 1:
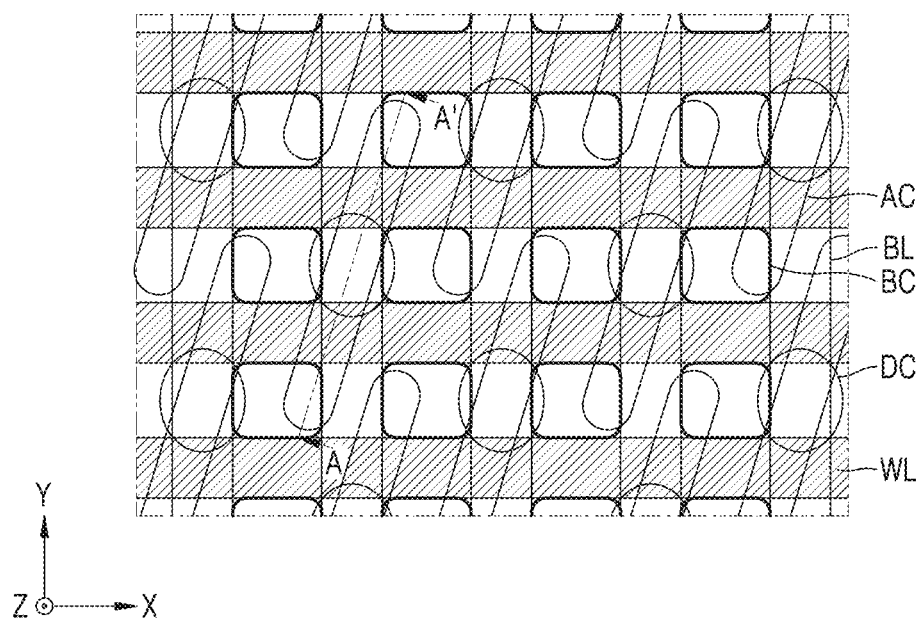
FIG. 1 is a layout diagram of an integrated circuit device according to an example embodiment.
Figure 2:
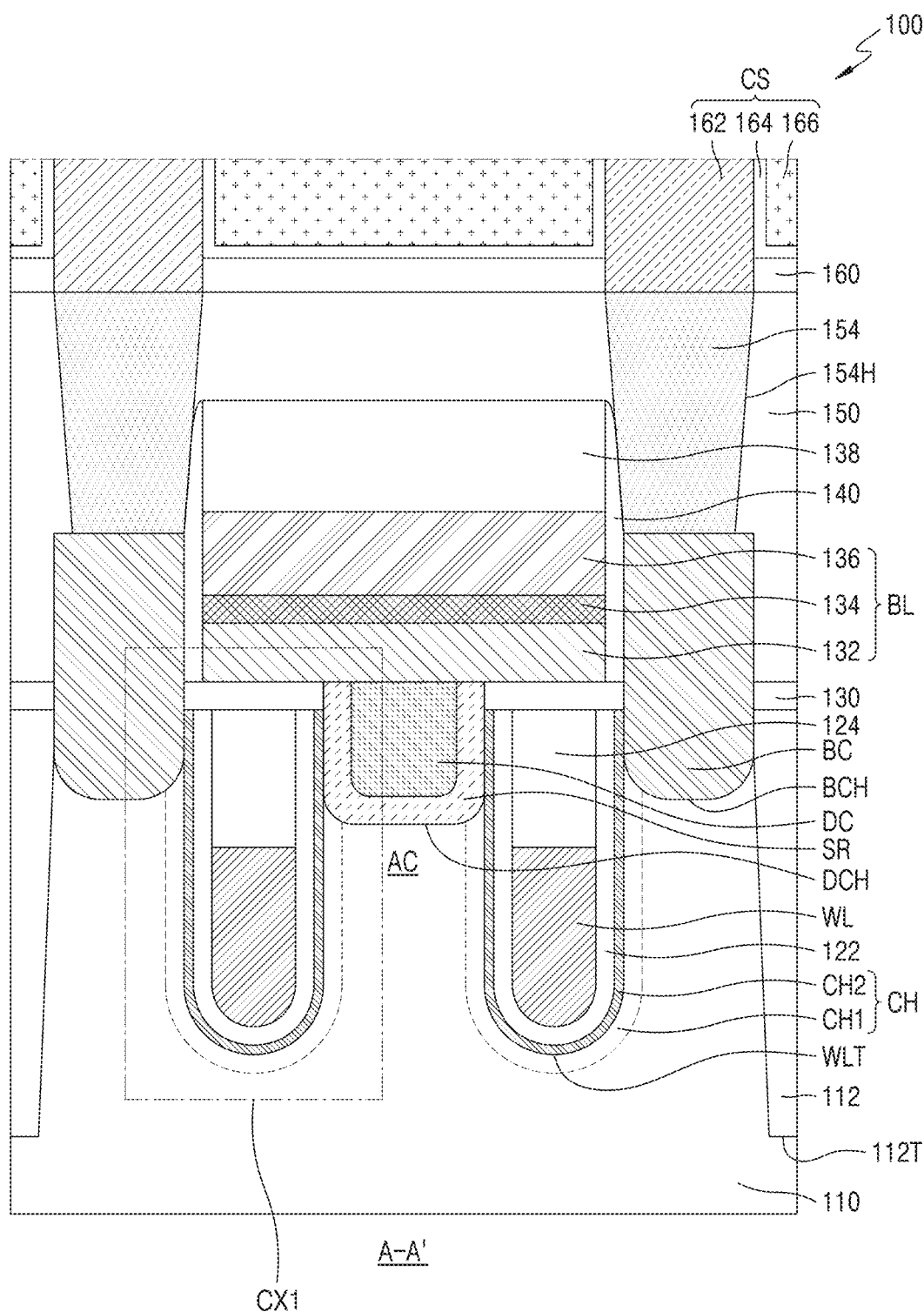
FIG. 2 is a cross-sectional view taken along a line A-A' of FIG. 1.

FIG. 1 is a layout diagram of an integrated circuit device 100 according to an example embodiment. FIG. 2 is a cross-sectional view taken along a line A-A' of FIG. 1, and FIG. 3 is an enlarged view of a part CX1 of FIG. 2.

Figure 3:
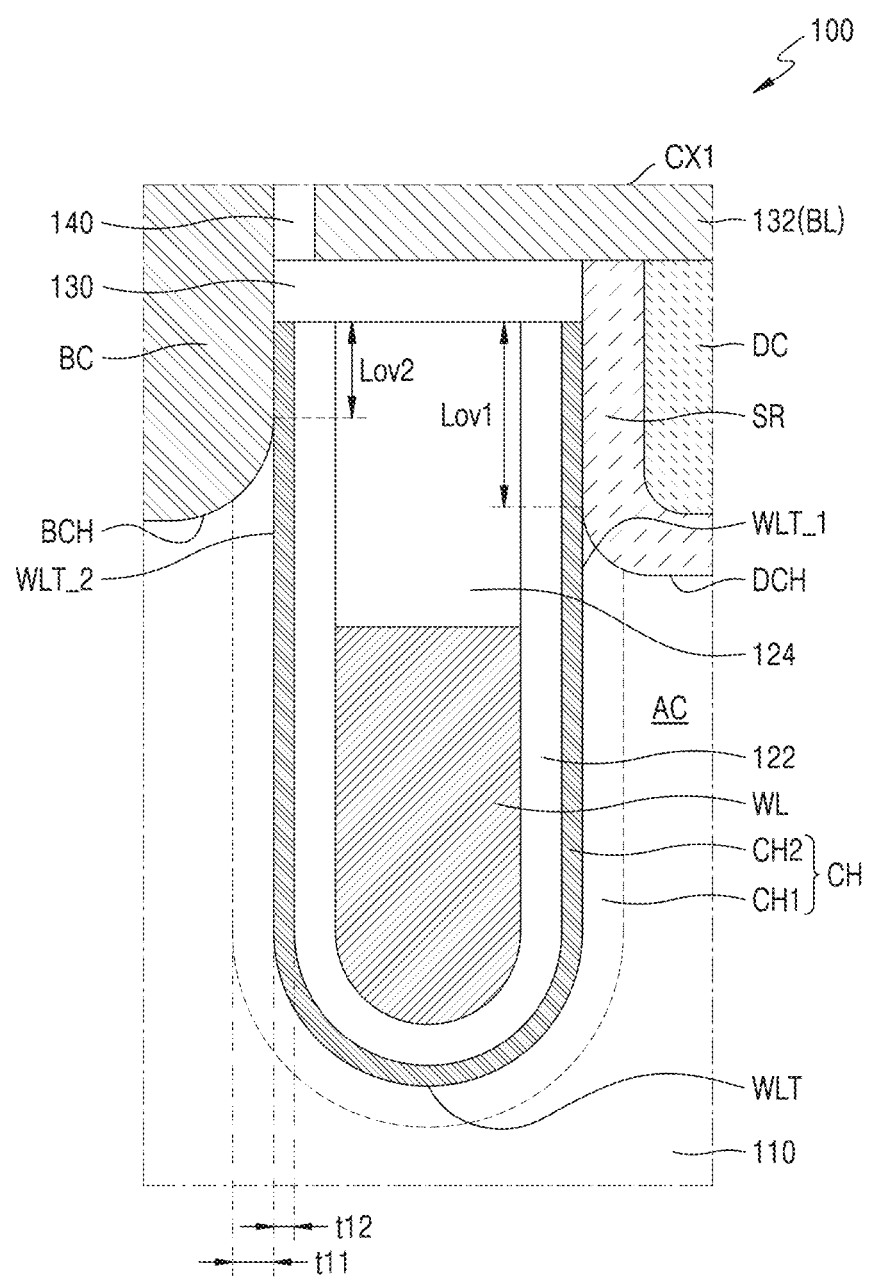
FIG. 3 is an enlarged view of a part CX1 of FIG. 2.

Referring to FIGS. 1 to 3, an isolation trench 112T may be formed in a substrate 110 and an isolation film 112 may be formed in the isolation trench 112T. A plurality of active regions AC may be defined in the substrate 110 by the isolation film 112.

The plurality of active regions AC each may be provided to have a long axis in a diagonal direction with respect to a first direction X and a second direction Y. A plurality of word lines WL may extend across the plurality of active regions AC in the first direction X and are parallel with each other in the second direction Y.

A plurality of bit lines BL may extend on the plurality of word lines WL in the second direction Y and are parallel with each other in the first direction X. The plurality of bit lines BL may be connected to the plurality of active regions AC through a direct contact DC.

A plurality of drain regions BC may be provided between two adjacent bit lines BL among the plurality of bit lines BL. The plurality of drain regions BC may be arranged in a line in the first direction X and the second direction Y. A plurality of landing pads 154 may be formed on the plurality of drain regions BC. The plurality of landing pads 154 may connect a lower electrode 162 of a capacitor structure CS on (or over) the plurality of bit lines BL to the active region AC.

The substrate 110 may include silicon, for example, single crystal silicon, polycrystalline silicon or amorphous silicon. In other example embodiments, the substrate 110 may include at least one selected from among Ge, SiGe, SiC, GaAs, InAs and InP. In some example embodiments, the substrate 110 may include a conductive region, for example, a well doped with impurities or a structure doped with impurities. The isolation film 112 may include an oxide film, a nitride film or a combination thereof.

A plurality of word line trenches WLT extending in the first direction X are formed in the substrate 110. Each of the plurality of word line trenches WLT may have a first side wall (or alternatively, a first sidewall portion) WLT_1 and a second side wall WLT_2 opposite to the first side wall (or alternatively, a first sidewall portion) WLT_1, and for example, the first side wall WLT_1 and the second side wall WLT_2 may extend in the first direction X while facing each other. The first side wall WLT_1 may be provided adjacent to a source region SR and the direct contact DC, and the second side wall WLT_2 may be provided adjacent to the drain region BC.

A channel region CH may be formed in a portion of the substrate 110 adjacent to the plurality of word line trenches WLT and on a surface of the substrate 110. The channel region CH may include a first channel region CH1 in a portion of the substrate 110 adjacent to a corresponding one of the plurality of word line trenches WLTs and a second channel region CH2 on an inner wall of a corresponding one of the plurality of word line trenches WLT. In other words, the first channel region CH1 is a portion of the substrate 110 that is outside the corresponding one of the plurality of word line trenches WLT and the second channel region CH2 is inside the corresponding one of the plurality of word line trenches WLT.

The first channel region CH1 may refer to a portion of the substrate 110 having a first thickness t11 from a surface of the substrate 110 exposed on the inner walls of the word line trenches WLT. For example, the first thickness t11 may be in a range of about 1 nm to about 20 nm but example embodiments are not limited thereto.

In some example embodiments, the first channel region CH1 may be a portion of the substrate 110 and include, for example, at least one among silicon, germanium, silicon germanium, SiC, GaAs, InAs, and InP. In some examples, the first channel region CH1 may include silicon doped with n-type impurities. In other examples, the first channel region CH1 may include silicon doped with p-type impurities.

The second channel region CH2 may conformally cover a surface of the first channel region CH1 on the inner walls of the plurality of word line trenches WLT. The second channel region CH2 may have a second thickness t12, and the second thickness t12 may be in a range of about 1 to 30 Å but example embodiments are not limited thereto.

In some example embodiments, the second channel region CH2 may include a two-dimensional (2D) material of a second conductivity type, and the 2D material may be, for example, a 2D Dirac source material. In some examples, the second channel region CH2 may include a monolayer formed of a Dirac source material. In other examples, the second channel region CH2 may include two to five layers of the Dirac source material.

Figure 4A:
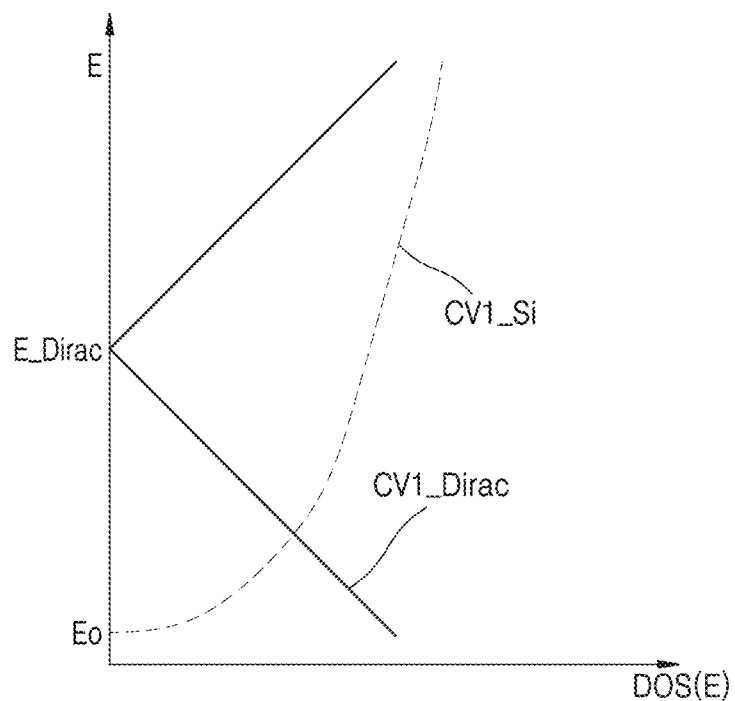
FIG. 4A is a graph schematically showing an energy level and a density of state DOS of a two-dimensional (2D) Dirac source material.
Figure 4B:
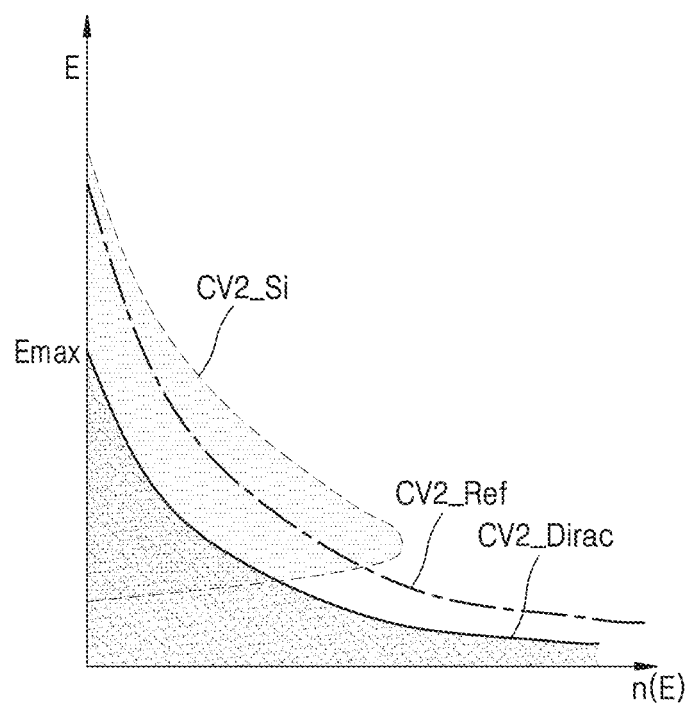
FIG. 4B is a graph schematically showing an energy level and the number of electrons of a 2D Dirac source material.

The 2D Dirac source material may refer to a material having an energy state as shown in FIGS. 4A and 4B. FIG. 4A is a graph schematically showing an energy level E and a density of state DOS of a 2D Dirac source material. In FIG. 4A, a density-of-state curve CV1_Dirac of the 2D Dirac source material is represented by a solid line, and a density-of-state curve CV1_Si of silicon is represented by a broken line for comparison. FIG. 4B illustrates an energy level E of the 2D Dirac source material and the number n(E) of electrons or the number of states thereof. In FIG. 4B, an electron number curve CV2_Dirac of the 2D Dirac source material is represented by a solid line, and an electron number curve CV2_Si of silicon is represented by a broken line and a reference electron number curve CV2_Ref according to the Boltzmann distribution is represented by an alternated long and short dash line for comparison.

Referring to FIG. 4A, in the case of silicon having a three-dimensional (3D) structure, a state of density DOS at an energy level higher than a reference energy level Eo is proportional to a ½ square of the energy level E (e.g., DOS∝$E^{1/2}$) and has a so-called "parabolic dispersion". In other words, as indicated by the broken line in FIG. 4A, silicon has a density of state DOS with a parabolic form as the energy level E increases.

In the case of the 2D Dirac source material, the density of state DOS is linearly proportional to the energy level E (e.g., DOS∝E) and has a so-called "linear dispersion". In other words, as indicated by the solid line in FIG. 4A, the 2D Dirac source material has a profile of the density of state DOS in which the density of state DOS decreases linearly as the energy level E increases until the energy level E reaches a Dirac energy level E_Dirac, the density of state DOS is zero when the energy level E reaches the Dirac energy level E_Dirac, and the density of state DOS increases linearly as the energy level E increases in a range of the energy level E higher than the Dirac energy level E_Dirac.

A magnitude or gradient of the density-of-state curve CV1_Si of silicon shown in FIG. 4A and a magnitude or gradient of the density-of-state curve CV1_Dirac of the 2D Dirac source material are only examples and the inventive concepts are not limited to those shown in FIG. 4A.

Referring to FIG. 4B, silicon having a three-dimensional (3D) structure (as shown in CV2_Si) has a distribution of electrons having an energy level higher than that of the reference electron number curve CV2_Ref according to the Boltzmann distribution. On the other hand, the 2D Dirac source material (as shown in CV2_Dirac) has a distribution of electrons having an energy level lower than that of the reference electron number curve CV2_Ref according to the Boltzmann distribution. The 2D Dirac source material may exhibit a maximum energy level Emax lower than a maximum energy level of the reference electron number curve CV2_Ref according to the Boltzmann distribution.

According to the electron number curve CV2_Si of silicon having a 3D structure, there are electrons having an energy level higher than an energy distribution of the reference electron number curve CV2_Ref according to the Boltzmann distribution, and the electrons having a high energy level (electrons generally referred to as long-tail electrons) may pass through a relatively high energy barrier in an off state in a hot electron injection method. Therefore, it is known that sub-threshold voltage swing characteristics may have a value greater than or equal to 60 mV/dec (mV/decade).

On the other hand, the 2D Dirac source material has a distribution of electrons having a lower energy level than the electron number curve CV2_Ref according to the Boltzmann distribution and thus the electrons pass through an energy barrier in a cold electron injection method. Electrons may pass through a relatively low energy barrier in an on state but all of the electrons cannot pass through a relatively high energy barrier in an off state. Therefore, it is known that sub-threshold voltage swing characteristics may have a value smaller than 60 mV/dec.

Referring back to FIGS. 1 to 3, the 2D Dirac source material included in the second channel region CH2 may include at least one of Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

For example, Pmmn boron may have a 2D structure of boron atoms belonging to an Orthorhombic space group. Graphene may have a 2D structure of carbon atoms arranged in a honeycomb structure. Graphene may consist of carbon atoms with sp2 bonding. Graphyne may refer to a flat sheet of carbon atoms arranged according to a rule or a hexagonal lattice structure in which carbon atoms with sp bonding and sp2 bonding are arranged regularly. Silicene may have a 2D structure of silicon atoms arranged in a honeycomb structure, and germanene may have a 2D structure of germanium atoms arranged in a honeycomb structure.

As shown in FIG. 3, the channel region CH may have a structure in which the first channel region CH1 and the second channel region CH2 overlap each other along the inner walls of the word line trenches WLT and thus may have relatively low sub-threshold voltage swing characteristics (e.g., a sub-threshold voltage swing value less than 60 mV/dec).

In the plurality of word line trenches WLTs, a plurality of gate insulating layers 122, a plurality of word lines WL and a plurality of gate capping layers 124 may be arranged.

The gate insulating layers 122 may be conformally provided on an upper side (e.g., an upper surface) of the second channel region CH2 on the inner walls of the word line trenches WLT. The word lines WL may be provided in lower portions of the word line trenches WLT, and the side walls and the bottom surface of the word lines WL may be surrounded by the gate insulating layers 122. Upper portions of the word line trenches WLT on the word lines WL may be filled with the gate capping layers 124.

In some example embodiments, the plurality of word lines WL may include at least one of Ti, TiN, Ta, TaN, W, WN, TiSiN, WSiN, polysilicon, or a combination thereof. The gate insulating layer 122 may include a silicon oxide film, a silicon nitride film, a silicon oxynitride film, an oxide/nitride/oxide (ONO) film, or a high-k dielectric film having a higher dielectric constant than the silicon oxide film. The gate capping layer 124 may include a silicon oxide film, a silicon nitride film, a silicon oxynitride film, or a combination thereof.

A first insulating layer 130 may be provided on the substrate 110 to cover upper sides (e.g., upper surfaces) of the gate capping layers 124. In some examples, the first insulating layer 130 may include a silicon oxide, a silicon oxynitride, a silicon nitride, or a combination thereof.

A first recess DCH may be provided in the substrate 110 to be adjacent to the first side wall WLT_1 of the word line trench WLT, and the source region SR may be in contact with an inner wall of the first recess DCH. The source region SR may be connected to a plurality of active regions AC. The source region SR may include a 2D Dirac source material of a second conductivity type. For example, in the source region SR, a 2D Dirac source material may be conformally formed to a certain thickness on the inner wall of the first recess DCH.

In some example embodiments, the 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

For example, the source region SR may include the same material as the 2D Dirac source material included in the second channel region CH2. For example, when the second channel region CH2 includes graphene doped with p-type impurities, the source region SR may also include graphene doped with p-type impurities. However, the inventive concepts are not limited thereto.

The source region SR may be in contact with the second channel region CH2 in a region adjacent to the first side wall WLT_1 of the word line trench WLT. As shown in FIG. 3, as the second channel region CH2 extends to the same vertical level as an upper side of the first insulating layer 130, a bottom side of the source region SR may be at a level lower than the upper side of the second channel region CH2 adjacent to the first side wall WLT_1 and the source region SR and the second channel region CH2 may overlap each other along a third direction Z by a first overlap length Lov1.

The direct contact DC may be provided on the source region SR to fill the inside of the first recess DCH. The direct contact DC may include silicon doped with impurities.

The plurality of bit lines BL may extend on the substrate 110 and the direct contact DC in the second direction Y. The plurality of bit lines BL may be connected to the plurality of active regions AC through the direct contact DC and the source region SR. The plurality of bit lines BL each may include a lower conductive layer 132, an intermediate conductive layer 134, and an upper conductive layer 136 stacked sequentially on the substrate 110. The lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon. The intermediate conductive layer 134 and the upper conductive layer 136 may each include TiN, TiSiN, W, tungsten silicide, or a combination thereof. In some example embodiments, the intermediate conductive layer 134 may be formed of TiN, TiSiN, or a combination thereof, and the upper conductive layer 136 may include W.

The plurality of bit lines BL each may be covered with one of a plurality of bit line capping layers 138. The plurality of bit line capping layers 138 may include silicon nitride. The plurality of bit line capping layers 138 may extend on the plurality of bit lines BL in the second direction Y.

A bit line spacer 140 may be provided on both side walls of each of the plurality of bit lines BL and may extend in the second direction Y between opposing side walls of the plurality of bit lines BL. In some example embodiments, the bit line spacer 140 may have a single-layer structure as shown in FIG. 2. In other example embodiments, the bit line spacer 140 may have a multi-material layer structure. For example, the bit line spacer 140 may include an air spacer structure having an air space surrounded between insulating layers.

A plurality of drain regions BC may be provided between the plurality of bit lines BL. For example, a drain region BC may be provided in a second recess BCH in the substrate 110, and an upper side (e.g., upper surface) thereof may extend vertically to a level higher than the upper side (e.g., upper surface) of the substrate 110 while passing through the first insulating layer 130. The drain region BC may be provided adjacent to the second side wall WLT_2 of the word line trench WLT. In some example embodiments, the drain region BC may include silicon doped with impurities.

The drain region BC may be in contact with the second channel region CH2 in a region adjacent to the second side wall WLT_2 of the word line trench WLT. As shown in FIG. 3, as the second channel region CH2 extends to the same vertical level as the upper side (e.g., upper surface) of the substrate 110, a bottom side (e.g., bottom) of the drain region BC may be at a level lower than the upper side (e.g., top) of the second channel region CH2 adjacent to the second side wall WLT_2 and the drain region BC and the second channel region CH2 may overlap each other by a second overlap length Lov2 when viewed from a side.

A second insulating layer 150 covering the bit lines BL, the bit line capping layer 138, the bit line spacer 140, and an upper side of the drain region BC may be provided on the first insulating layer 130. The second insulating layer 150 may include at least one among $SiO_2$, SiOCH, SiOC, SiN, and SiON.

The landing pad 154 may be provided on the drain region BC. The landing pad 154 may include a conductive barrier film (not separately shown) and a landing pad conductive layer (not separately shown). For example, the conductive barrier film may include Ti, TiN, or a combination thereof. The landing pad conductive layer may include a metal, a metal nitride, conductive polysilicon, or a combination thereof.

In some example embodiments, a metal silicide film (not shown) may be further provided between the drain region BC and the landing pad 154. The metal silicide film may include at least one among nickel silicide, cobalt silicide, and tungsten silicide.

An etch stop film 160 may be provided on the second insulating layer 150 and the landing pad 154, and a capacitor structure CS may be provided on the etch stop film 160. The capacitor structure CS may include the lower electrode 162, a capacitor dielectric layer 164, and an upper electrode 166, and a bottom portion of the lower electrode 162 may be located on the landing pad 154 while passing through the etch stop film 160.

In a dynamic random access memory (DRAM) device, a cell transistor having a buried channel transistor (BCAT) structure may be connected to a capacitor structure to store data in the capacitor structure. For example, when a silicon substrate is used as a channel area, electron mobility occurs by hot electron injection and thus a small amount of electrons may pass through an energy barrier in an off state, thereby causing undesired leakage current to occur. Therefore, a refresh operation may be periodically performed to reduce undesired leakage current, thus increasing power consumption of the integrated circuit device.

However, according to the above-described example embodiments, the channel region CH may include the first channel region CH1 corresponding to a portion of a silicon substrate and the second channel region CH2 including a monolayer of a 2D Dirac source material, and the source region SR may include the 2D Dirac source material. Therefore, electron mobility may occur by cold electron injection using the 2D Dirac source material and thus electrons cannot pass through an energy barrier in an off state, thereby reducing undesired leakage current. The integrated circuit device 100 may have low power consumption.

Figure 5:
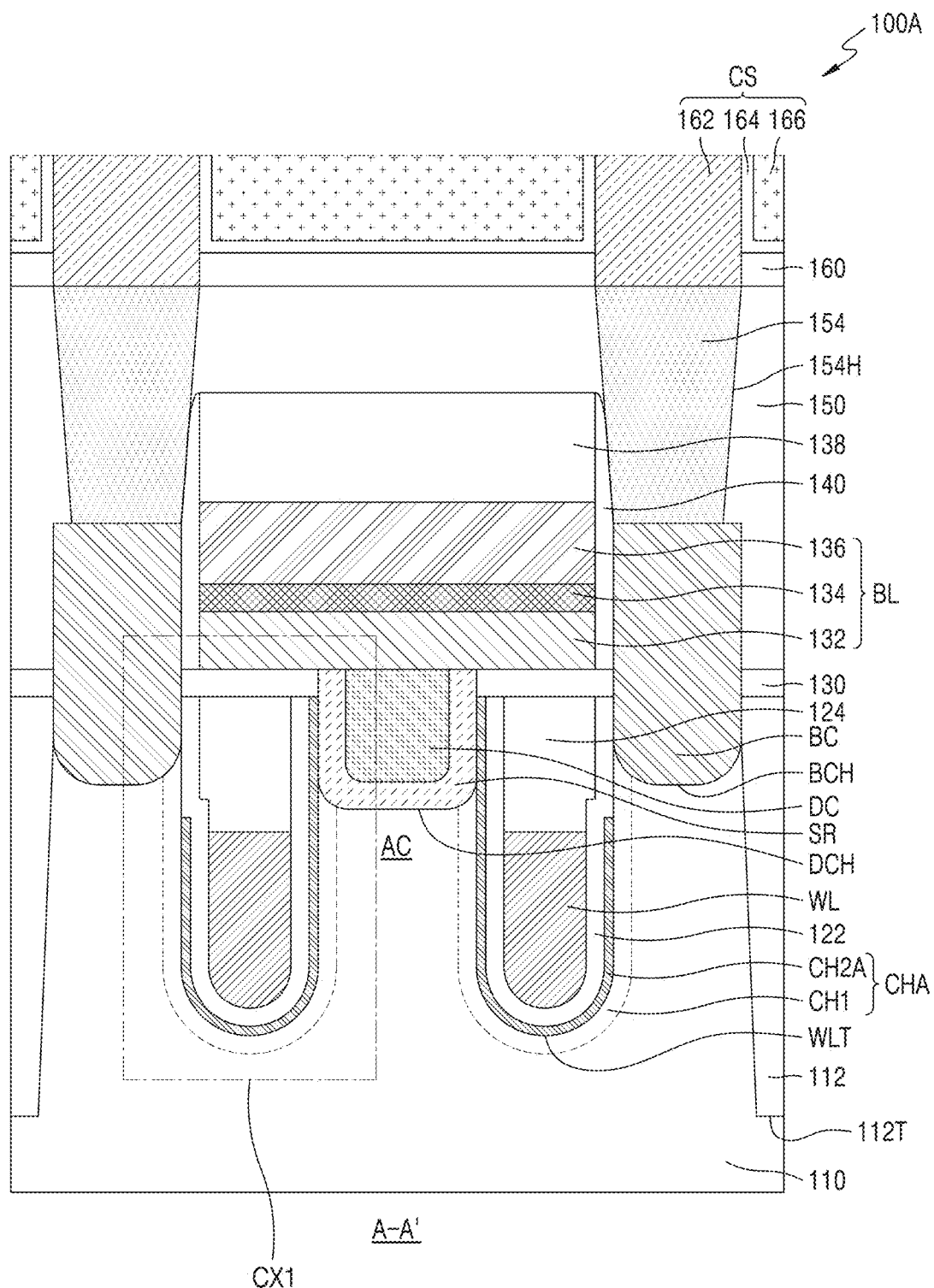
FIG. 5 is a cross-sectional view of an integrated circuit device according to an example embodiment.
Figure 6:
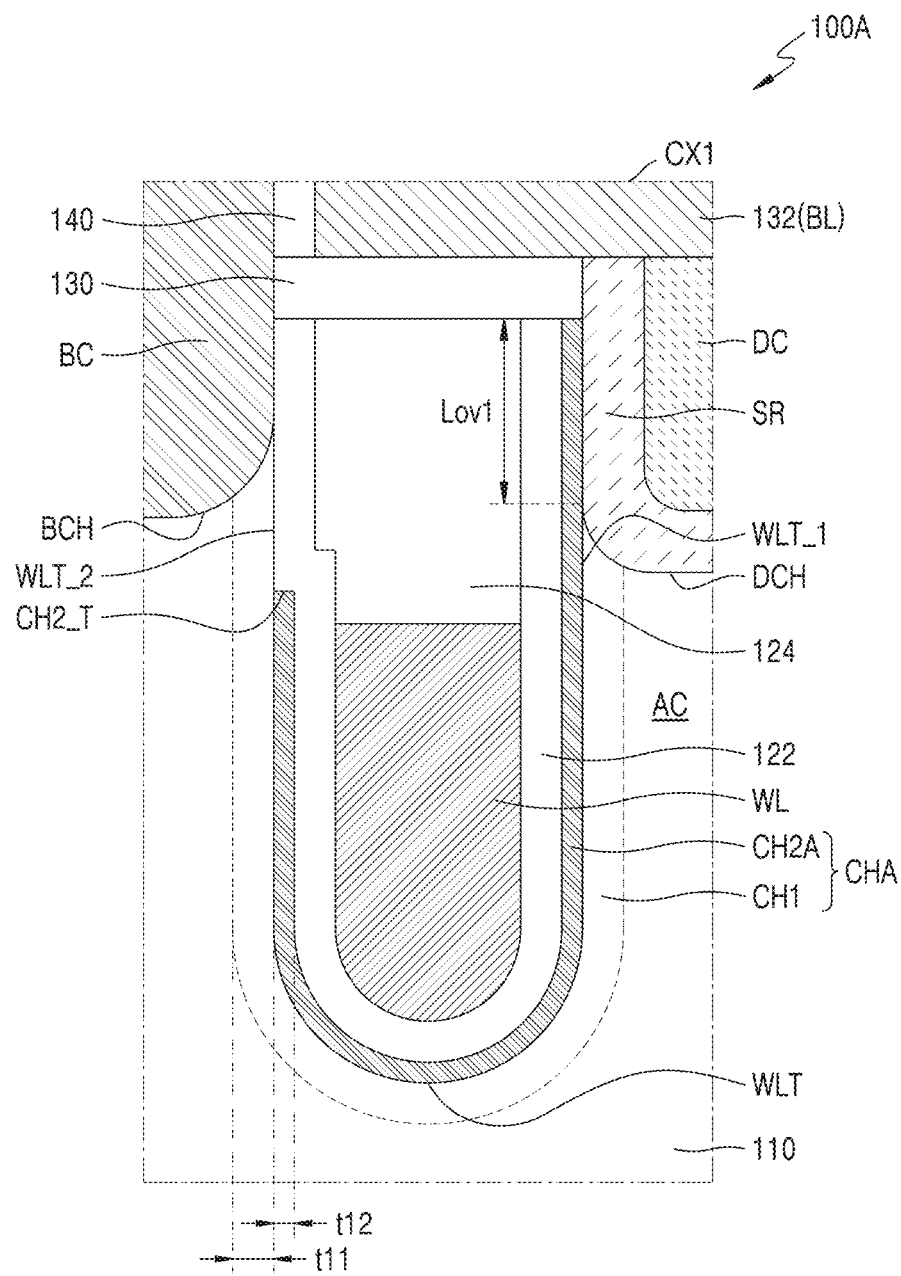
FIG. 6 is an enlarged view of a part CX1 of FIG. 5.

FIG. 5 is a cross-sectional view of an integrated circuit device 100A according to an example embodiment. FIG. 6 is an enlarged view of a part CX1 of FIG. 5. In FIGS. 5 and 6, reference numerals that are the same as those in FIGS. 1 to 3 denote the same components.

Referring to FIGS. 5 and 6, a channel region CHA may include a first channel region CH1 and a second channel region CH2A, and the second channel region CH2A may extend from a first side wall WLT_1 of a word line trench WLT to a second side wall WLT_2. An upper side (e.g., top) CH2_T of the second channel region CH2A on the second side wall WLT_2 may be at a level that is lower than a bottom side (e.g., a bottom) of a drain region BC and higher than an upper side (e.g., upper surface) of a word line WL. The drain region BC and a portion of the first channel region CH1 adjacent to the drain region BC may be in contact with a gate insulating layer 122.

Figure 7:
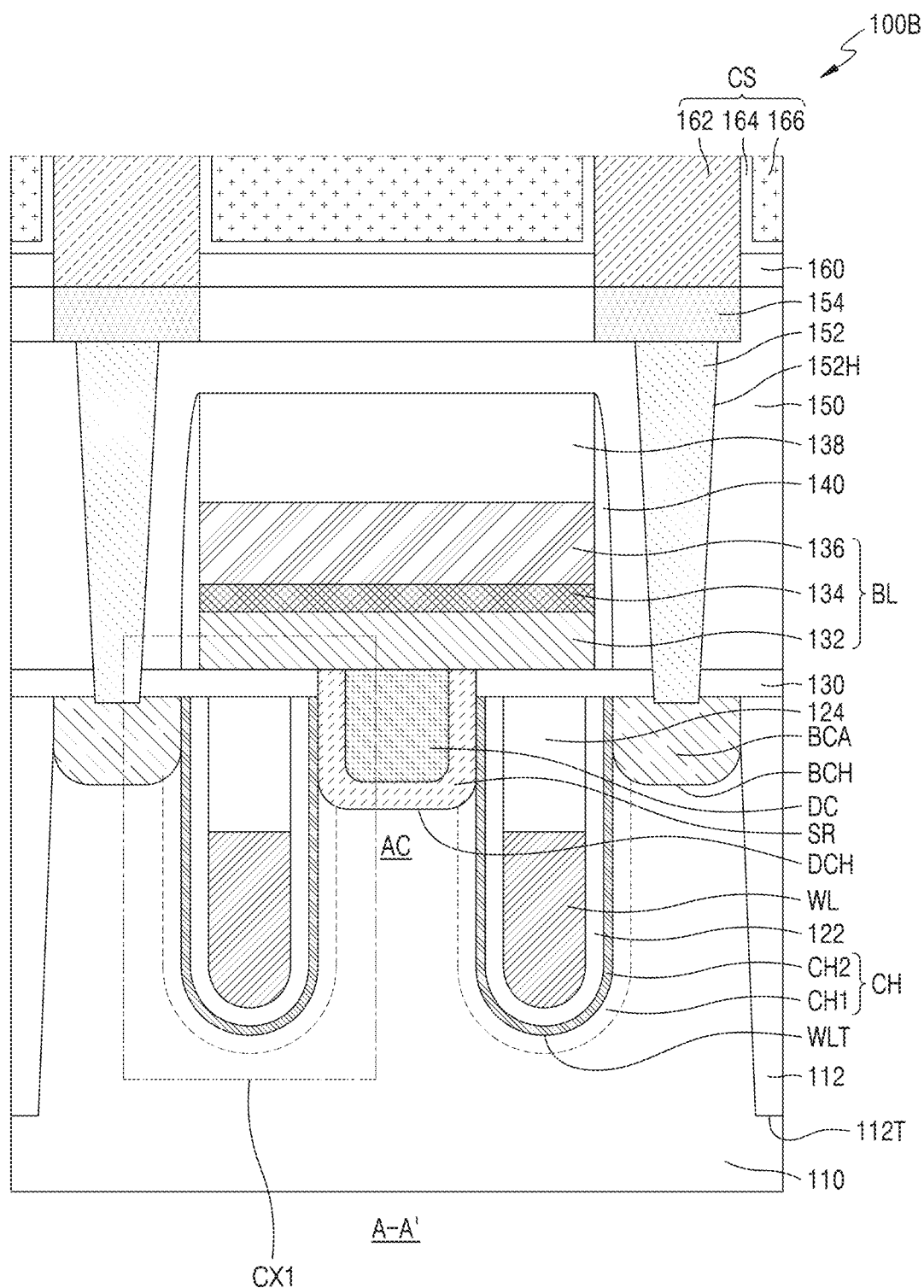
FIG. 7 is a cross-sectional view of an integrated circuit device according to an example embodiment.
Figure 8:
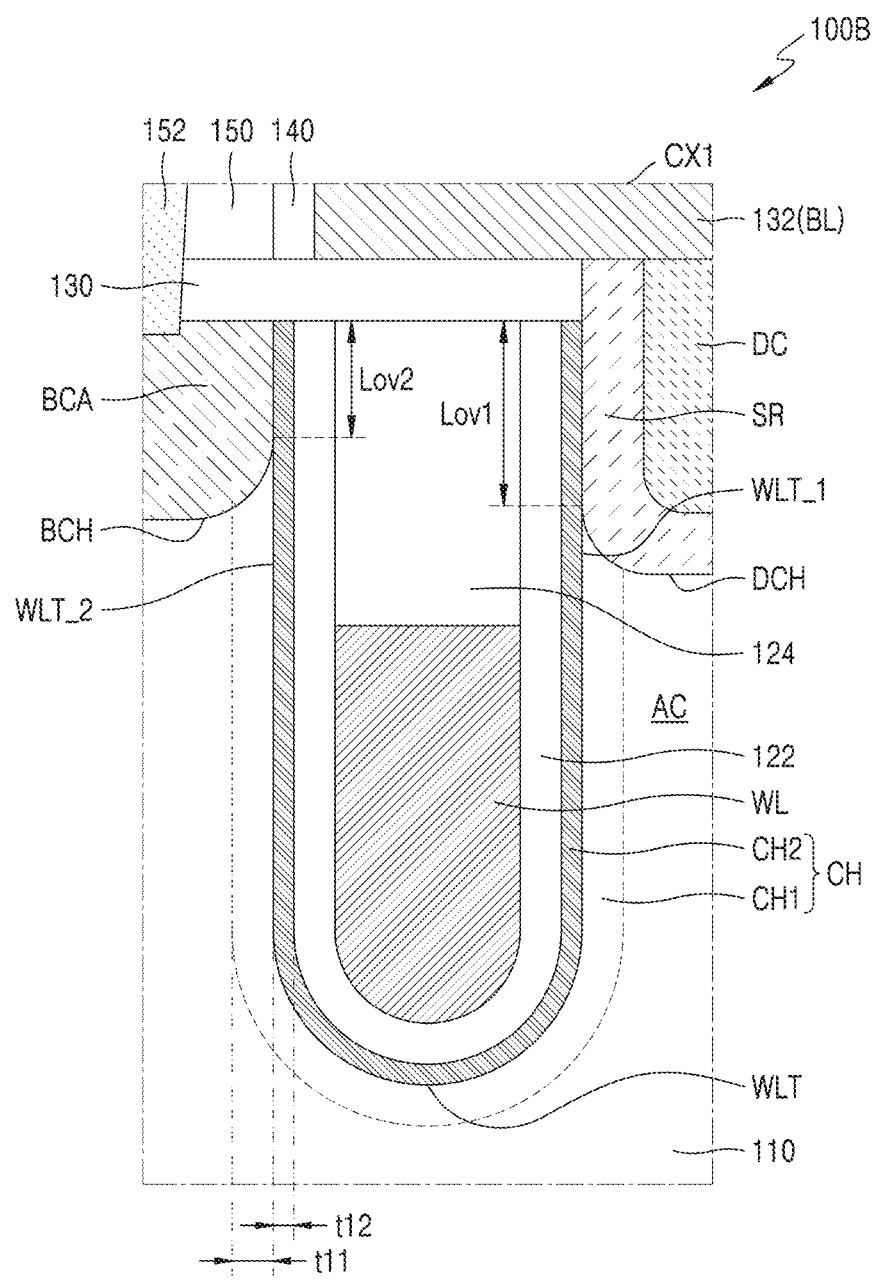
FIG. 8 is an enlarged view of a part CX1 of FIG. 7.

FIG. 7 is a cross-sectional view of an integrated circuit device 100B according to an example embodiment. FIG. 8 is an enlarged view of a part CX1 of FIG. 7. In FIGS. 7 and 8, reference numerals that are the same as those in FIGS. 1 to 3 denote the same components.

Referring to FIGS. 7 and 8, a drain region BCA may be provided in a second recess BCH in a substrate 110 to be adjacent to a second side wall WLT_2 of a word line trench WLT. In some example embodiments, the drain region BCA may include a 2D Dirac source material of a second conductivity type.

For example, the 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

In some examples, the drain region BCA may include the same material as the 2D Dirac source material included in a source region SR. For example, when the source region SR includes graphene doped with p-type impurities, the drain region BCA may also include graphene doped with p-type impurities. However, the inventive concepts are not limited thereto.

FIG. 7 illustrates an example in which an upper side (e.g., upper surface) of the drain region BCA is at the same level as an upper side (e.g., upper surface) of the substrate 110 and is covered with a first insulating layer 130, however, in other example embodiments, the upper side (e.g., upper surface) of the drain region BC may be at a level higher than the upper side (e.g., upper surface) of the substrate 110.

A drain contact 152 may be provided in a contact hole 152H passing through a second insulating layer 150 and a first insulating layer 130 and may be connected to the drain region BCA. A landing pad 154 may be provided on the drain contact 152.

In some example embodiments, the drain contact 152 may include silicon doped with N-type impurities, and a metal silicide film (not shown) may be formed between the landing pad 154 and the drain contact 152. The landing pad 154 may include a conductive barrier film (not separately shown) and a landing pad conductive layer (not separately shown). For example, the conductive barrier film may include Ti, TiN, or a combination thereof. The landing pad conductive layer may include a metal, a metal nitride, conductive polysilicon, or a combination thereof.

Unlike that shown in FIG. 2, a bottom side (e.g., bottom surface) of the landing pad 154 may be provided at a level higher than an upper side (e.g., upper surface) of the bit line capping layer 138 so that the bottom side (e.g., bottom surface) of the landing pad 154 may not be in contact with the upper side (e.g., upper surface) of the bit line capping layer 138.

Figure 9:
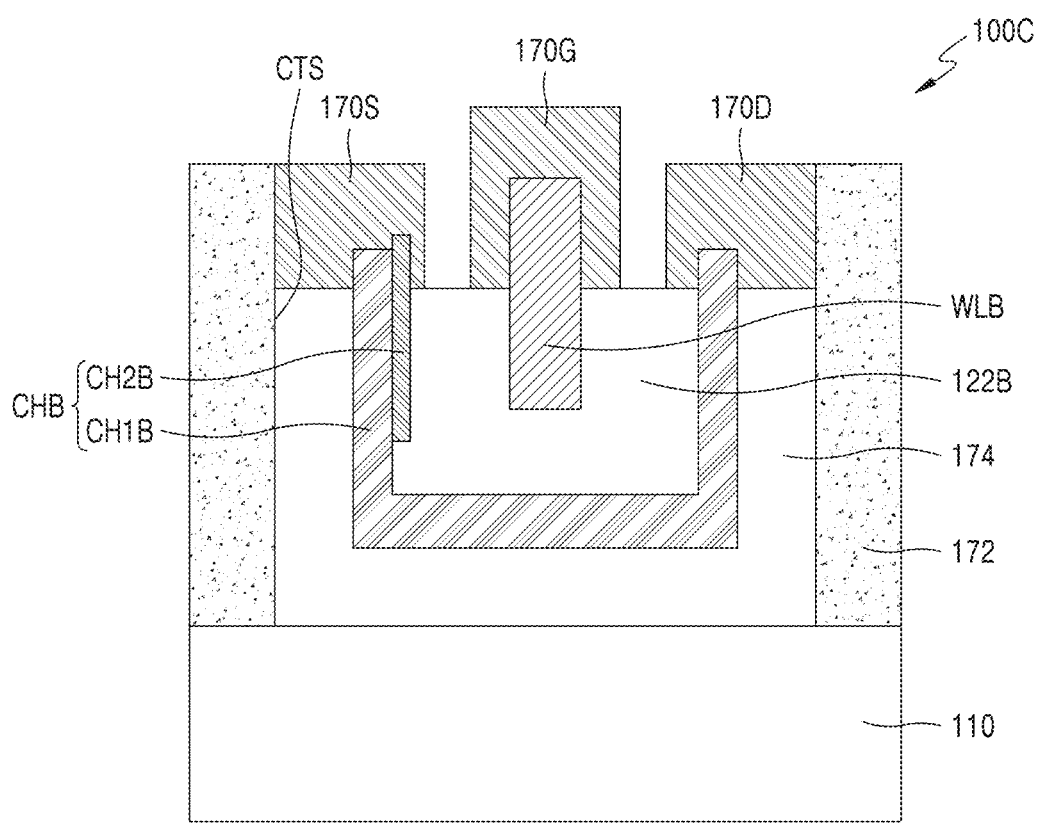
FIG. 9 is a cross-sectional view of an integrated circuit device according to an example embodiment.

FIG. 9 is a cross-sectional view of an integrated circuit device 100C according to some example embodiments. In FIG. 9, reference numerals that are the same as those in FIGS. 1 to 8 denote the same components.

Referring to FIG. 9, a plurality of word line shields 172 may be provided on a substrate 110 and a cell transistor space CTS may be defined between adjacent two word line shields 172. The word line shields 172 may include a 2D Dirac source material, for example, graphene.

A buffer insulating layer 174, a gate insulating layer 122B, a channel region CHB, and a word line WLB each including a 2D material may be provided in the cell transistor space CTS.

The buffer insulating layer 174 may be conformally provided on an inner wall of the cell transistor space CTS, for example, on an upper side (e.g., upper surface) of the substrate 110 and side walls of the word line shields 172, and have a U-shaped vertical cross section.

In some example embodiments, the buffer insulating layer 174 may include a hexagonal boron nitride (h-BN). For example, the buffer insulating layer 174 may have a thickness of 5 to 20 nm.

The channel region CHB may be provided on the buffer insulating layer 174 and include a first channel region CH1B and a second channel region CH2B.

The first channel region CH1B may be conformally provided on the buffer insulating layer 174 and may have a U-shaped vertical cross section. For example, the first channel region CH1B may include a 2D material of an n-type conductive type. For example, the first channel region CH1B may include a wide band gap 2D material, e.g., $MoS_2$ or InSe. In some example embodiments, the first channel region CH1B may be a monolayer formed of the 2D material or include two to five layers. The first channel region CH1B may have a thickness of about 5 to 30 Å.

The second channel region CH2B may be provided at a side (or an inner sidewall) of the first channel region CH1B and include a 2D Dirac source material. In some example embodiments, the second channel region CH2B may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

In some example embodiments, the second channel region CH2B may include a monolayer formed of the 2D Dirac source material. In other example embodiments, the second channel region CH2B may include two to five layers of the 2D Dirac source material. The second channel region CH2B may have a thickness of about 1 to 30 Å. Although an example in which the second channel region CH2B includes only a portion extending vertically on a side wall of the first channel region CH1B is illustrated, the second channel region CH2B may be also provided on other side walls and/or an upper side (e.g., top) of the first channel region CH1B to extend on an entirety of the inner wall of the first channel region CH1B.

As the first channel region CH1B has the U-shaped vertical cross section, the channel region CHB may have a relatively large length and a short channel effect may be mitigated or prevented.

The gate insulating layer 122B may be provided on an inner wall of the channel region CHB. The gate insulating layer 122B may have a U-shaped vertical cross section. For example, the gate insulating layer 122B may include a hexagonal boron nitride (h-BN). For example, the gate insulating layer 122B may have a thickness of 5 to 20 nm.

The word line WLB may be provided on the gate insulating layer 122B. The word line WLB may include the 2D Dirac source material, for example, graphene. A width of the word line WLB may be about 2 to 20 nm but example embodiments are not limited thereto.

A source electrode 170S may be provided on the buffer insulating layer 174 to cover one end of the channel region CHB. For example, the source electrode 170S may be arranged to cover both the first channel region CH1B and the second channel region CH2B. A drain electrode 170D may be provided on the buffer insulating layer 174 to cover another end of the channel region CHB. A gate electrode 170G may be provided on the buffer insulating layer 174 to cover the word line WLB and to be spaced apart from the source electrode 170S and the drain electrode 170D.

The source electrode 170A, the drain electrode 170D, and the gate electrode 170G may each include at least one among a transition metal, a metal nitride, or a noble metal. For example, the source electrode 170S, the drain electrode 170D, and the gate electrode 170G may have a double layer structure including either nickel and platinum or titanium and gold but example embodiments are not limited thereto.

Although not shown, a capacitor structure (not shown) electrically connected to the drain electrode 170D may be further provided.

According to the above-described example embodiments, as a cell transistor is formed of a 2D material, the integrated circuit device 100C has a high on-current and has low power consumption.

Figure 10:
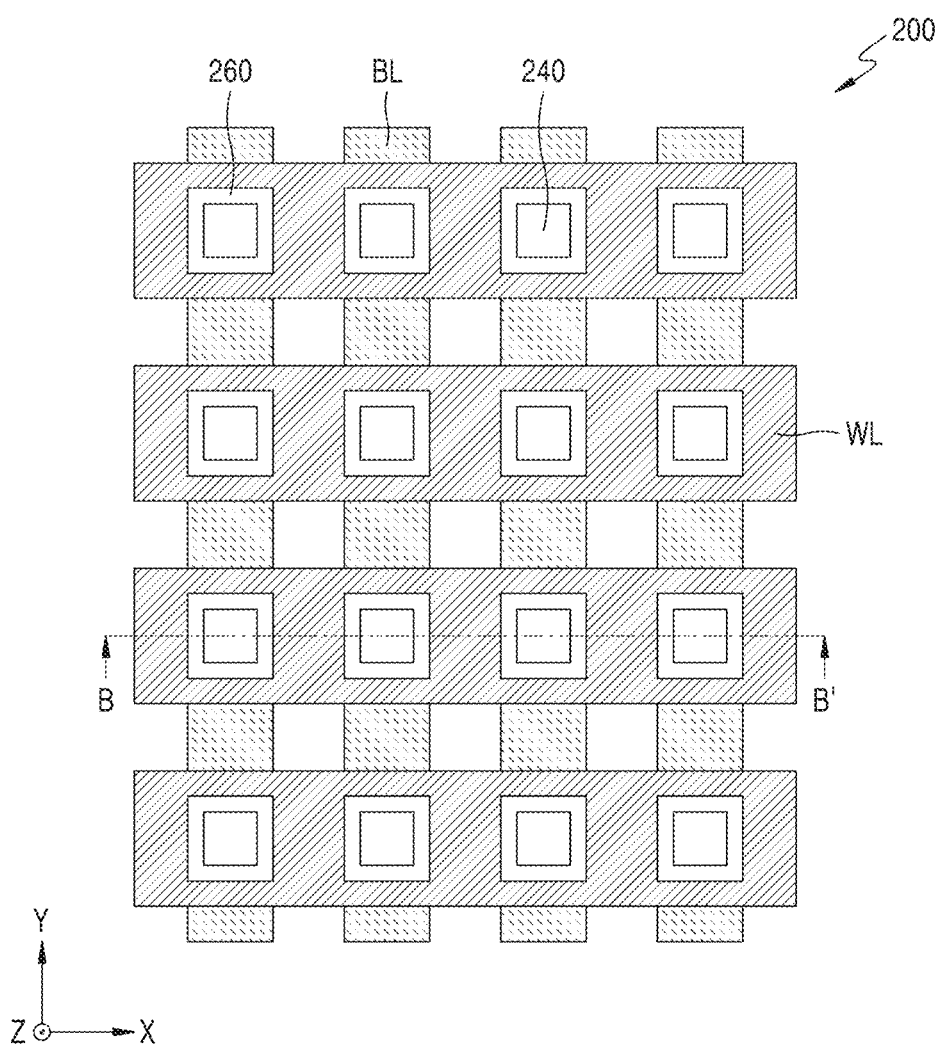
FIG. 10 is a layout diagram of an integrated circuit device according to an example embodiment.
Figure 11:
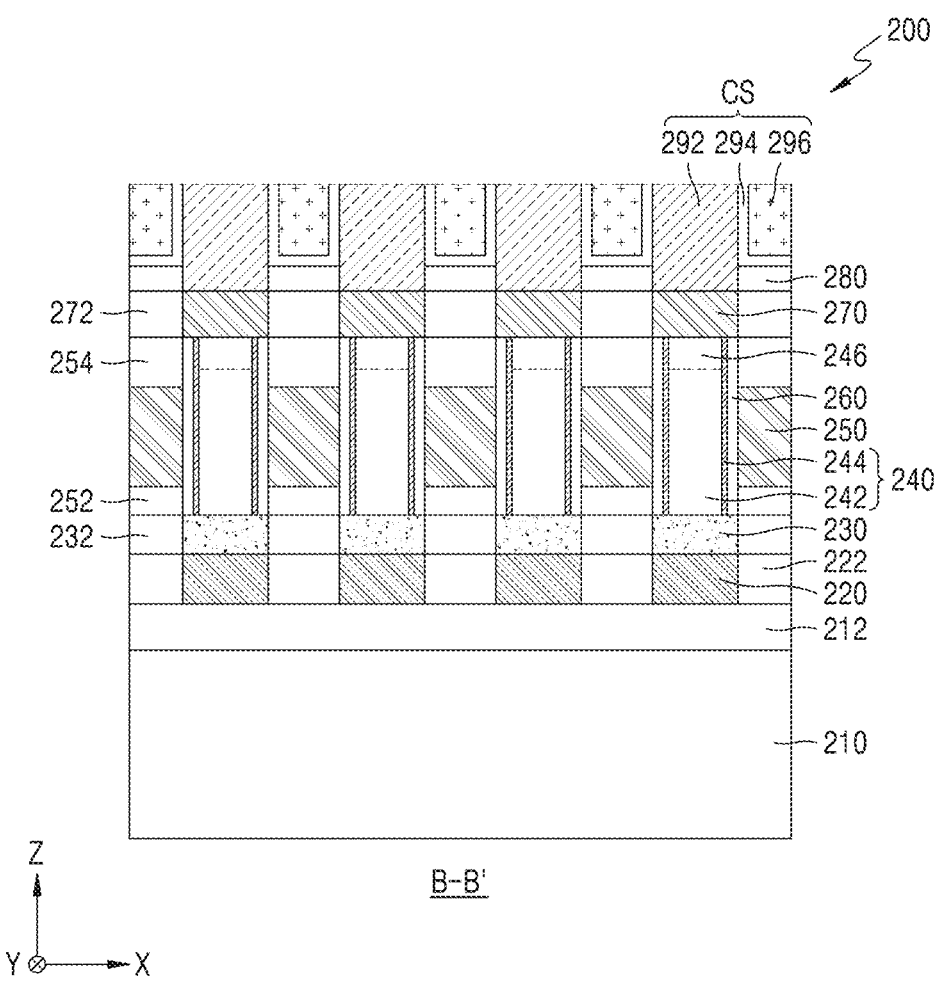
FIG. 11 is a cross-sectional view taken along a line B-B' of FIG. 10.

FIG. 10 is a layout diagram of an integrated circuit device 200 according to an example embodiment. FIG. 11 is a cross-sectional view taken along line B-B' of FIG. 10. In FIGS. 10 and 11, reference numerals that are the same as those in FIGS. 1 to 9 denote the same components.

Referring to FIGS. 10 and 11, the integrated circuit device 200 may include a plurality of first conductive lines 220, a channel region 240, a gate electrode 250, a gate insulating layer 260, and a capacitor structure CS that are arranged on a substrate 210. The integrated circuit device 200 may be a memory device with a vertical channel transistor (VCT), and the VCT may refer to a structure in which a channel length of a channel region 240 extends from the substrate 210 in a vertical direction.

A lower insulating layer 212 may be provided on the substrate 210, and the plurality of first conductive lines 220 may be provided on the lower insulating layer 212 to be spaced apart from each other in a first horizontal direction X and extend in a second horizontal direction Y. A first insulating layer 222 may be provided on the lower insulating layer 212 to fill a space between the plurality of first conductive lines 220. The plurality of first conductive lines 220 may correspond to bit lines BL of the integrated circuit device 200.

In some example embodiments, the plurality of first conductive lines 220 may include doped polysilicon, a metal, conductive metal nitride, conductive metal silicide, conductive metal oxide, or a combination thereof. For example, the plurality of first conductive lines 220 may include, but the inventive concepts are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. The plurality of first conductive lines 220 may include a single layer or multiple layers formed of any of the materials described above. In some example embodiments, the plurality of first conductive lines 220 may include a 2D semiconductor material, and the 2D semiconductor material may include, for example, graphene, carbon nanotube or a combination thereof.

Source regions 230 may be arranged in an island form on the plurality of first conductive lines 220 to be spaced apart from each other in the first horizontal direction X and the second horizontal direction Y. Side walls of the source region 230 may be surrounded by second insulating layers 232.

In some example embodiments, the source region 230 may include a 2D Dirac source material. The 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

Channel regions 240 may be arranged in an island form on the plurality of first conductive lines 220 to be spaced apart from each other in the first horizontal direction X and the second horizontal direction Y. In some example embodiments, the channel region 240 may include a first channel region 242 having a pillar shape and a second channel region 244 surrounding an outer side wall of the first channel region 242. The channel region 240 may have a first width in the first horizontal direction X and a first height in a vertical direction Z, and the first height may be greater than the first width. For example, the first height may be about 2 to 10 times the first width but the inventive concepts are not limited thereto.

In some example embodiments, the first channel region 242 may include an oxide semiconductor, and the oxide semiconductor may include, for example, $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$ or a combination thereof. The first channel region 242 may include a single layer or multiple layers formed of the oxide semiconductor. In some examples, the first channel region 242 may have a bandgap energy level higher than that of silicon. For example, the first channel region 242 may have band gap energy of about 1.5 eV to 5.6 eV. For example, the first channel region 242 may exhibit optimal or improved channel performance when the first channel region 242 has band gap energy of about 2.0 eV to 4.0 eV. For example, the first channel region 242 may include a polycrystalline or amorphous film but the inventive concepts are not limited thereto. In some example embodiments, the first channel region 242 may include a 2D semiconductor material, and the 2D semiconductor material may include, for example, graphene, carbon nanotube or a combination thereof.

In some example embodiments, the second channel region 244 may include a 2D Dirac source material and include a monolayer formed of a Dirac source material. The 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

A drain region 246 may be provided on the first channel region 242. Sidewalls of the drain region 246 may be surrounded by the second channel region 244. The drain region 246 may be formed integrally with the first channel region 242 and formed by doping impurities on an upper portion of the first channel region 242 but the inventive concepts are not limited thereto.

The gate electrode 250 may extend in a first direction (an X-axis direction) while surrounding side walls of the channel region 240. In a plan view, the gate electrode 250 may be a gate-all-around type gate electrode surrounding all of the side walls (e.g., all of four side walls) of the channel region 240. The gate electrode 250 may correspond to word lines WL of the integrated circuit device 200.

In other example embodiments, the gate electrode 250 may be a dual gate type gate electrode and include, for example, a first sub-gate electrode (not shown) facing a first side wall of the channel region 240 and a second sub-gate electrode (not shown) facing a second side wall of the channel region 240 opposite to the first side wall. In other example embodiments, the gate electrode 250 may be a single gate type gate electrode covering only the first side wall of the channel region 240 and extending in the first horizontal direction X.

The gate electrode 250 may include doped polysilicon, a metal, a conductive metal nitride, a conductive metal silicide, a conductive metal oxide, or a combination thereof. For example, the gate electrode 250 may include, but the inventive concepts are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof.

The gate insulating layer 260 may surround the sidewalls of the channel region 240 and may be interposed between the channel region 240 and the gate electrode 250. In some example embodiments, the gate insulating layer 260 may include a silicon oxide film, a silicon oxynitride film, a high-k dielectric film having a higher dielectric constant than the silicon oxide film, or a combination thereof. The high-k dielectric film may be formed of a metal oxide or a metal oxynitride. For example, the high-k dielectric film available as the insulating layer 260 may include, but the inventive concepts are not limited to, $HfO_2$, HfSiO, HfSiON, HfTaO, HfTiO, HfZrO, $ZrO_2$, $Al_2O_3$, or a combination thereof.

A first buried insulating layer 252 surrounding a lower portion of the side wall of the channel region 240 may be provided on the plurality of second insulating layers 232, and a second buried insulating layer 254 surrounding an upper portion of the lower side wall of channel region 240 and covering the gate electrode 250 may be provided on the first buried insulating layer 252.

Capacitor contacts 270 may be provided on the drain region 246. The capacitor contacts 270 may be provided to vertically overlap the channel region 240 and may be arranged in a matrix to be spaced apart from each other in a first direction (an X-axis direction) and a second direction (a Y-axis direction). The capacitor contacts 270 may include, but the inventive concepts are not limited to, doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof. The upper insulating layer 272 may be provided on the second buried insulating layer 254 to surround sidewalls of the capacitor contacts 270.

An etch stop film 280 may be provided on the upper insulating layer 272 and a capacitor structure CS may be provided on the etch stop film 280. The capacitor structure CS may include a lower electrode 292, a capacitor dielectric layer 294, and an upper electrode 296.

Figure 12:
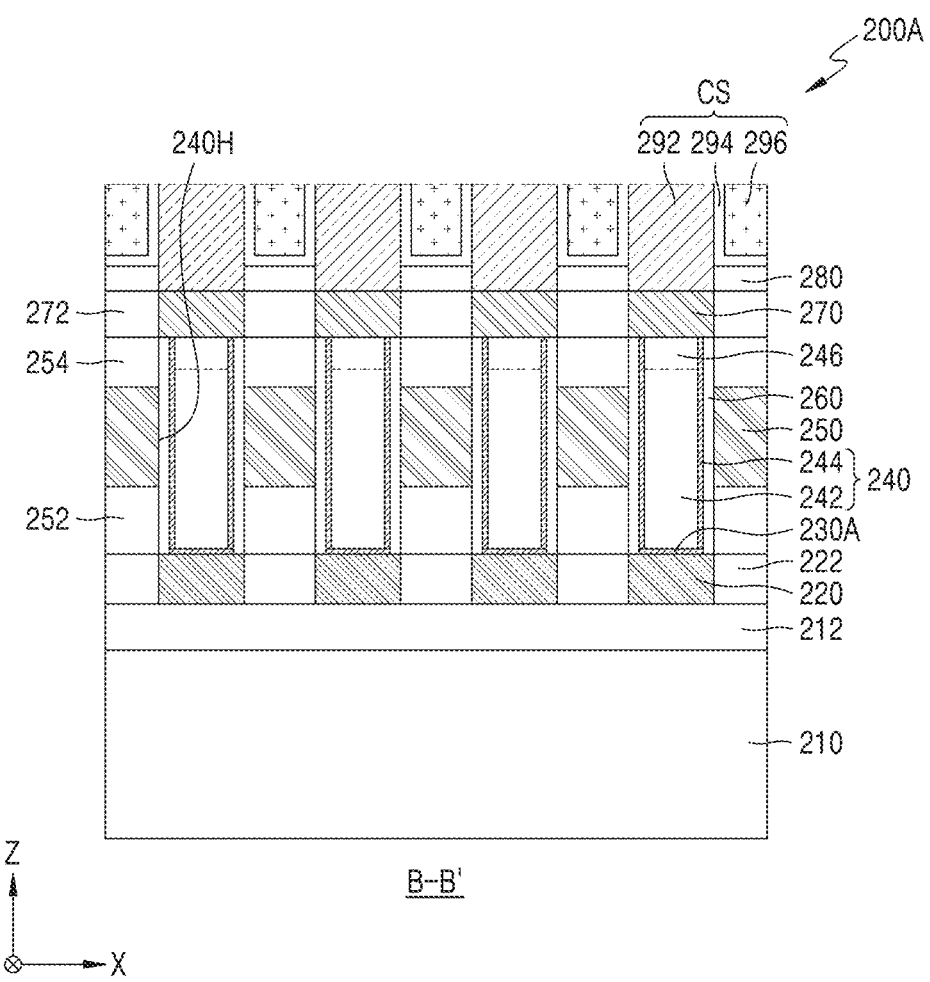
FIG. 12 is a cross-sectional view of an integrated circuit device according to an example embodiment.

FIG. 12 is a cross-sectional view of an integrated circuit device 200A according to an example embodiment.

Referring to FIG. 12, a plurality of openings 240H passing through a first buried insulating layer 252, a gate electrode 250, and a second buried insulating layer 254 may be provided to be spaced apart from each other in a first direction X and a second direction Y. Upper sides (e.g., upper surfaces) of a plurality of first conductive lines 220 may be located at the bottoms of the plurality of openings 240H and a gate insulating layer 260 may be provided on side walls of the plurality of openings 240H.

A source region 230A may be provided at the bottoms of the plurality of openings 240H. A channel region 240 filling the inside of the plurality of openings 240H may be provided on the source region 230A. The channel region 240 may include a first channel region 242 having a pillar shape and a second channel region 244 surrounding an outer side wall of the first channel region 242.

The source region 230A and the second channel region 244 may include the 2D Dirac source material. The source region 230A and the second channel region 244 may include the same material, and the source region 230A may be formed at the bottoms of the plurality of openings 240H simultaneously with the forming of the second channel region 244 on the side walls of the plurality of openings 240H. In this case, a thickness of the second channel region 244 may be the same as or substantially similar to that of the source region 230A as shown in FIG. 12. However, the inventive concepts are not limited thereto, and the thickness of the source region 230A may be formed to be greater than that of the second channel region 244.

FIGS. 13 to 20 are cross-sectional views illustrating a manufacturing method of an integrated circuit device according to a process order according to an example embodiment. A manufacturing method of the integrated circuit device 100 illustrated in FIGS. 1 to 3 will be described with reference to FIGS. 13 to 20 below.

Figure 13:
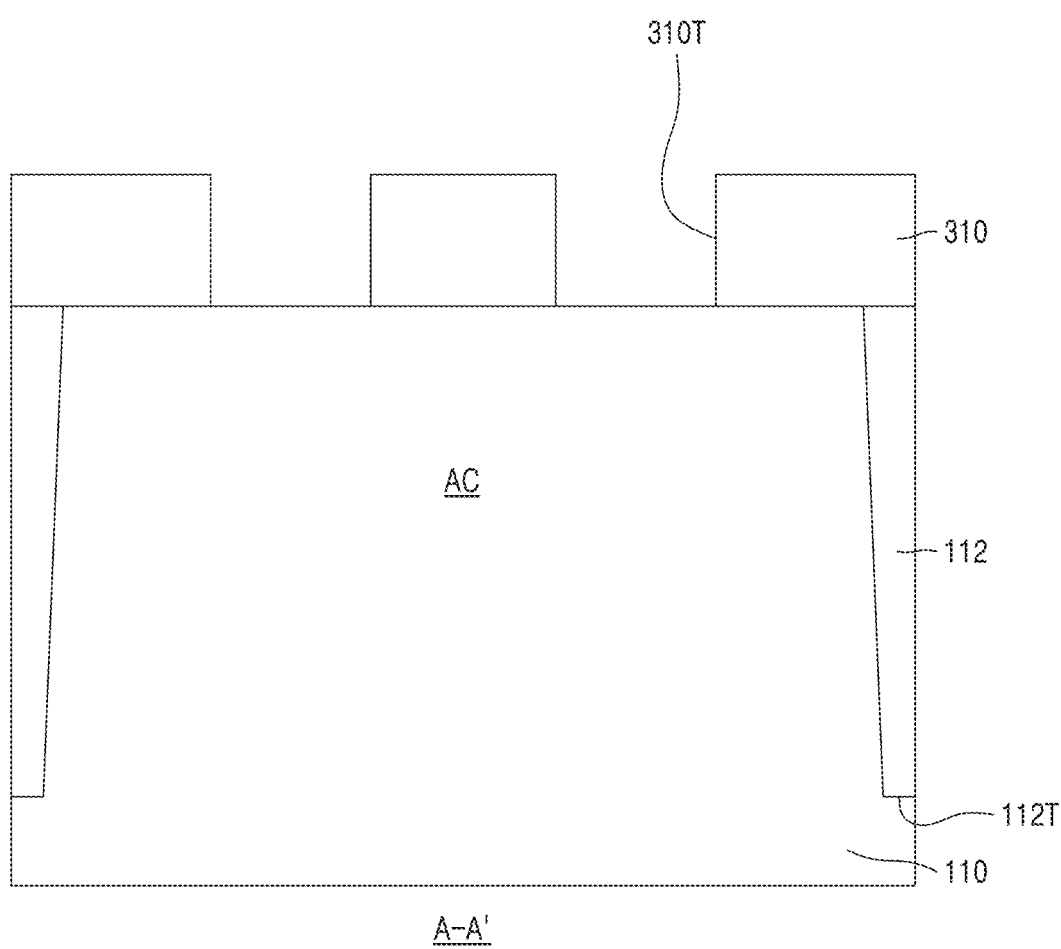
FIGS. 13 to 20 are cross-sectional views illustrating a manufacturing method of an integrated circuit device according to a process order according to an example embodiment.

Referring to FIG. 13, a plurality of isolation trenches 112T may be formed on a substrate 110 and an isolation film 112 may be formed in the plurality of isolation trenches 112T to define a plurality of active regions AC on the substrate 110. As shown in FIG. 1, the plurality of active regions AC may be each provided to have a long axis in a diagonal direction with respect to a first direction X and a second direction Y.

Thereafter, a first mask pattern 310 may be formed on the substrate 110. The first mask pattern 310 may have openings 310T extending in the first direction X.

Figure 14:
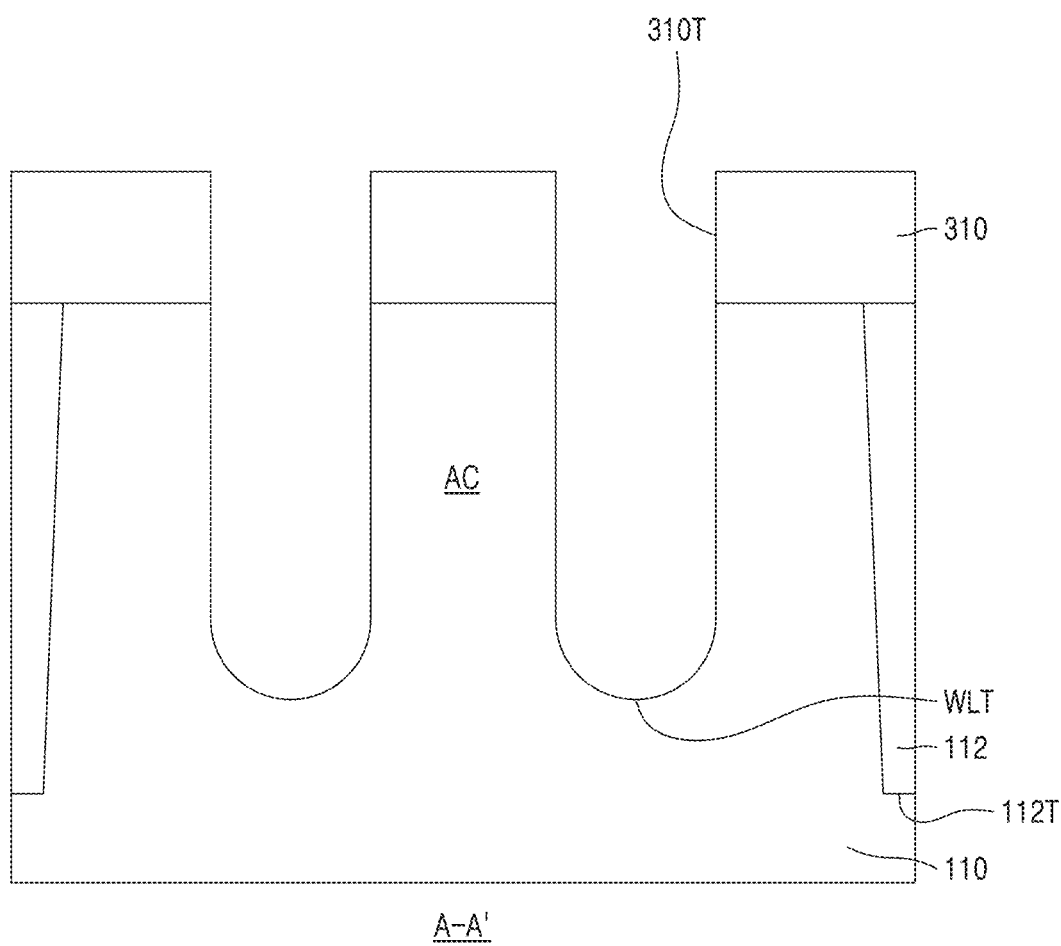

Referring to FIG. 14, word line trenches WLT may be formed in the substrate 110 by using the first mask pattern 310 as an etch mask. Thereafter, the word line trenches WLT may have a width of about 5 to 200 nm in the second direction Y.

Figure 15:
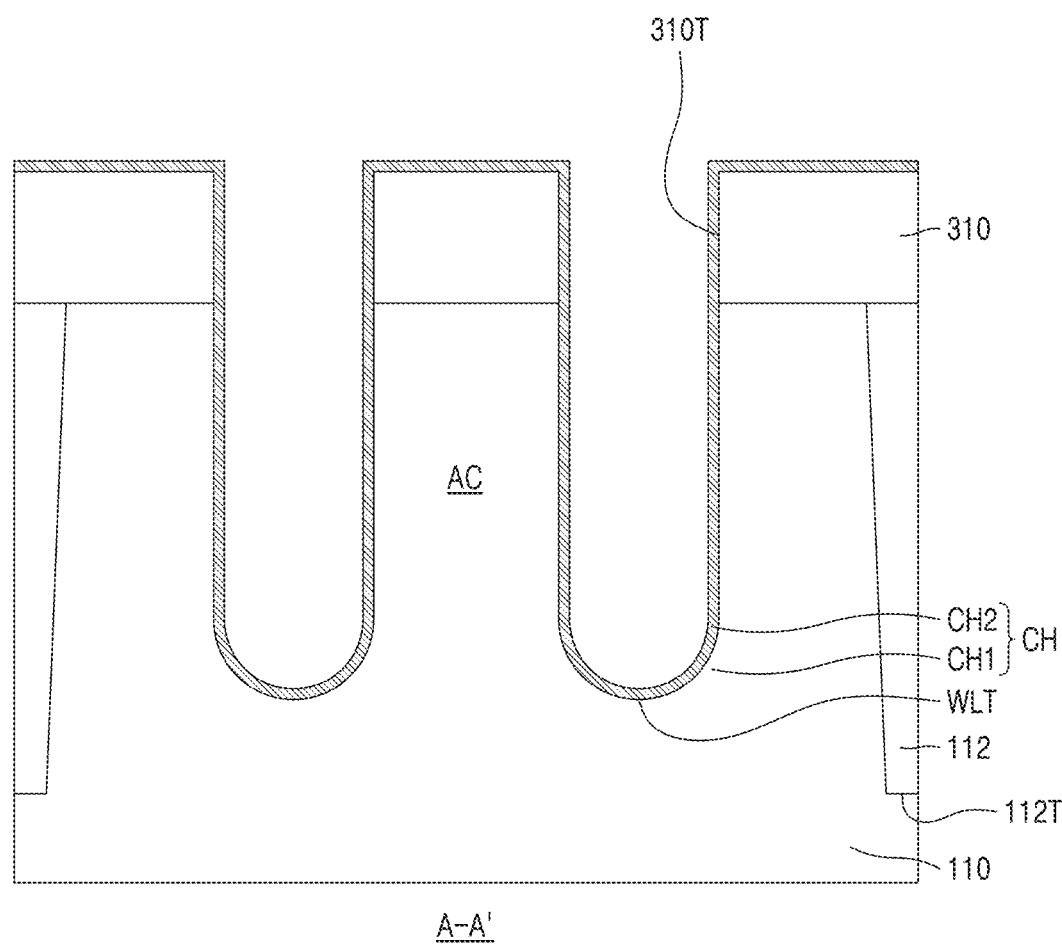

Referring to FIG. 15, a second channel region CH2 may be formed conformally on an inner wall of the word line trench WLT.

In some example embodiments, the second channel region CH2 may be formed using the 2D Dirac source material. The 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

In some example embodiments, the 2D Dirac source material may be formed by at least one among an atomic layer deposition (ALD) process, a chemical vapor deposition (CVD) process, a molecular beam epitaxy (MBE) process, and a physical vapor deposition (PVD) process.

For example, the forming of the second channel region CH2 may be a process of forming a monolayer of the 2D Dirac source material on the inner wall of a word line trench WLT. In some example embodiments, a precursor of the 2D Dirac source material may be supplied to the inner wall of the word line trench WLT by an ALD process and a remaining amount of the precursor that is not adsorbed onto the inner wall of the word line trench WLT may be removed to form a monolayer of the 2D Dirac source material on the inner wall of the word line trench WLT. In other example embodiments, as the supplying and removing of the precursor as described above is repeatedly performed, the 2D Dirac source material may be formed in two to five layers on the inner wall of the word line trench WLT.

In the forming of the second channel region CH2 or after the forming of the second channel region CH2, p-type impurities may be doped in a desired (or alternatively, predetermined) concentration onto the second channel region CH2.

In some example embodiments, the second channel region CH2 may have a second thickness t12 and the second thickness t12 may be in a range of about 1 to 30 Å but example embodiments are not limited thereto. In some examples, the second channel region CH2 may include a monolayer of graphene, and in this case, the second thickness t12 may be 3.4 Å.

Although not shown in FIG. 15, a portion of the second channel region CH2 on the inner wall of the word line trench WLT may be removed. For example, a reactive ion etching process, an angled ion beam etching process, a chemical mechanical polishing (CMP) process or the like may be performed on the inner wall of the word line trench WLT to remove a portion of the second channel region CH2 (e.g., a portion of the second channel region CH2 on a second side wall WLT_2 (see FIG. 3) of the word line trench WLT). In this case, the integrated circuit device 100A described above with reference to FIGS. 5 and 6 may be obtained.

Figure 16:
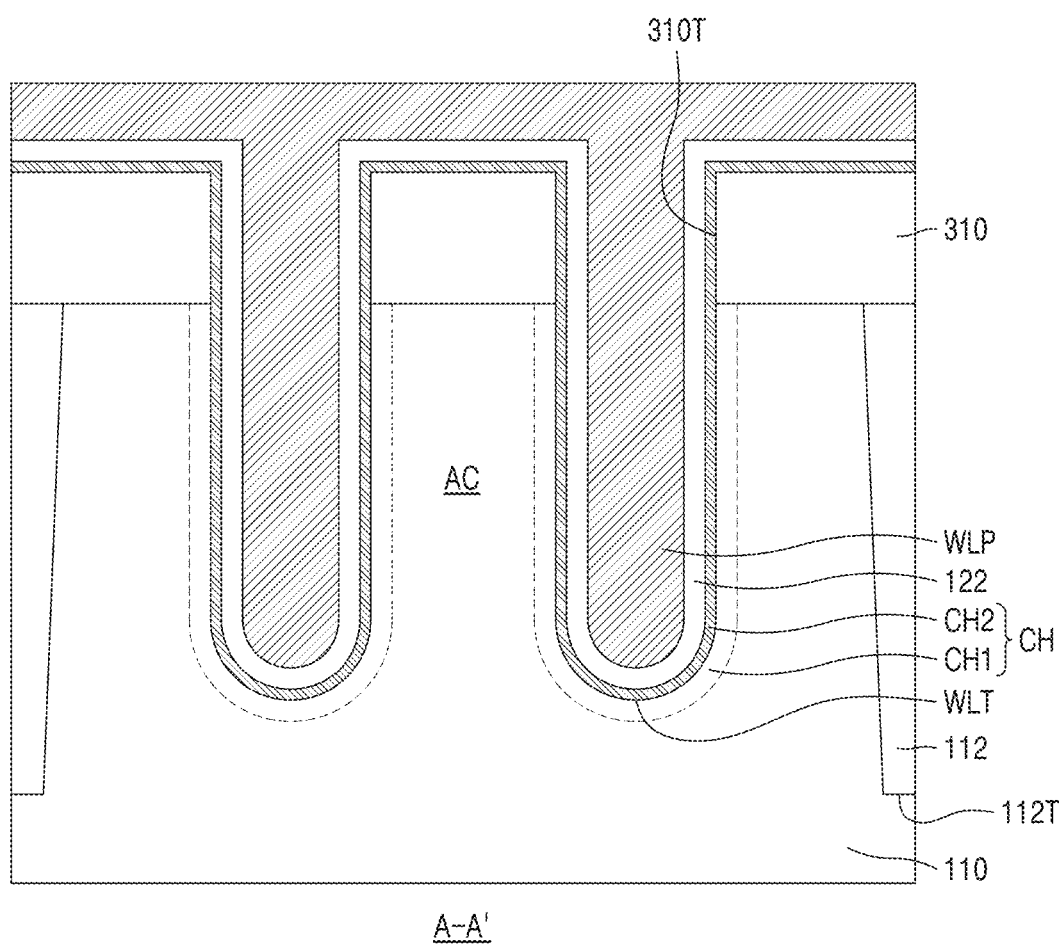

Referring to FIG. 16, a gate insulating layer 122 may be formed on the second channel region CH2 on the inner wall of the word line trench WLT.

In some example embodiments, the gate insulating layer 122 may include a silicon oxide film, a silicon nitride film, a silicon oxynitride film, an oxide/nitride/oxide (ONO) film, or a high-k dielectric film having a higher dielectric constant than the silicon oxide film.

Thereafter, a word line conductive layer WLP filling the inside of the word line trench WLT may be formed on the gate insulating layer 122.

In some example embodiments, the word line conductive layer WLP may include Ti, TiN, Ta, TaN, W, WN, TiSiN, WSiN, polysilicon, or a combination thereof.

Figure 17:
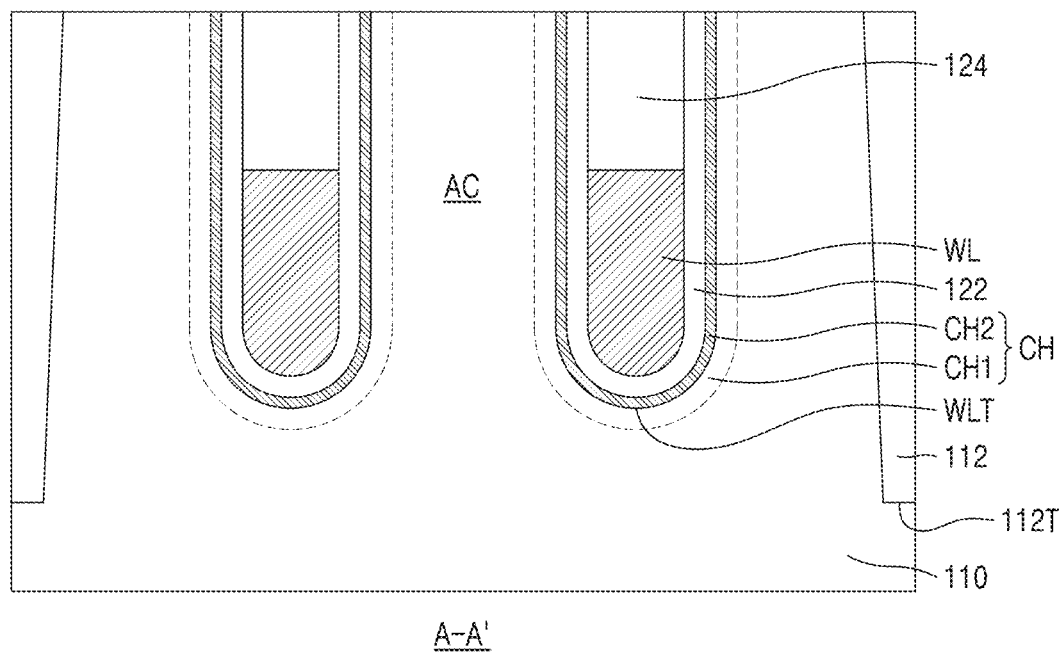

Referring to FIG. 17, a word line WL may formed by performing an etch back process on the word line conductive layer WLP (see FIG. 15).

Thereafter, an insulating layer (not shown) may be formed in the word line trench WLT, and a planarization process may be performed on an upper side (e.g., upper surface) of the insulating layer to form a gate capping layer 124. In the planarization process, the first mask pattern 310 (see FIG. 16) may be also removed.

Figure 18:
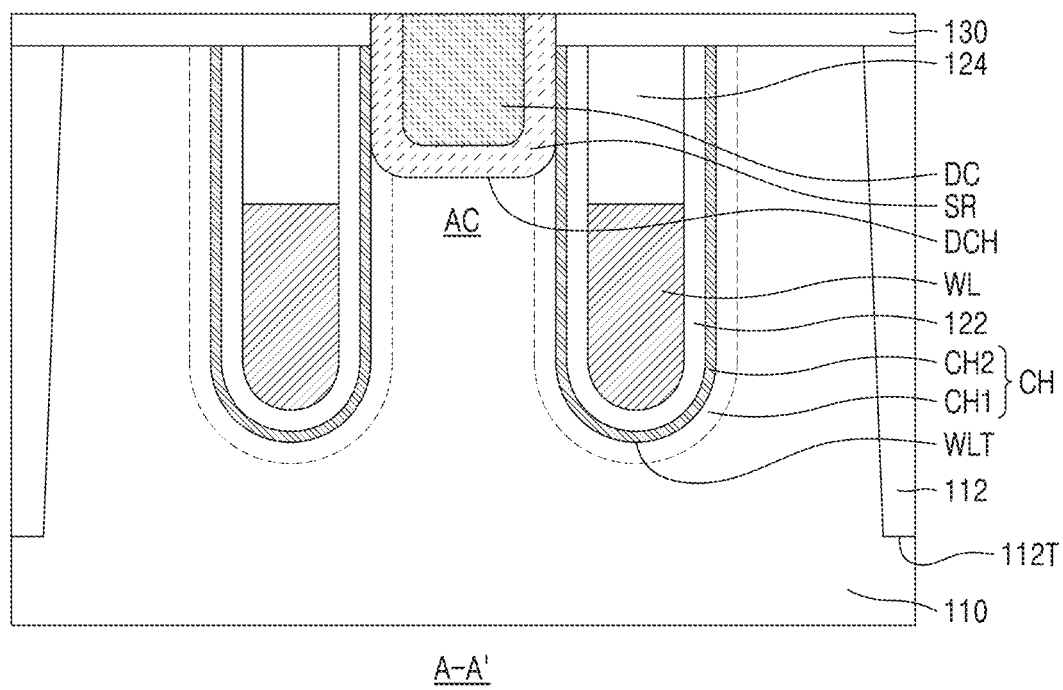

Referring to FIG. 18, a first insulating layer 130 may be formed on the substrate 110, a mask pattern (not shown) may be formed on the first insulating layer 130, and a portion of the substrate 110 and a portion of the isolation film 112 that are exposed through openings (not shown) of the mask pattern may be etched to form a first recess DCH for exposing the an active region AC of the substrate 110.

Thereafter, the mask pattern is removed and a source region SR and a direct contact DC are formed in the first recess DCH. In some example embodiments, the source region SR may be formed using the 2D Dirac source material. The 2D Dirac source material may include at least one among Pmmn boron, graphene, S-graphene, α-graphyne, 6, 6, 12-graphyne, 14, 14, 18-graphyne, square carbon, silicene, germanene, CO on Cu (111), $(VO_2)_3/(TiO_2)_5$, square octagon (so)-$MoS_2$, and $Pb_2(C_6H_4)_3$.

In some example embodiments, the 2D Dirac source material may be formed by at least one among an ALD process, a CVD process, an MBE process, and a PVD process. For example, the source region SR and the direct contact DC may be formed by forming a 2D Dirac source material layer to a certain thickness in the first recess DCH and on the first insulating layer 130, forming a conductive layer (not shown) on the 2D Dirac source material layer to a thickness sufficient to fill the first recess DCH, and etching back the 2D Dirac source material layer and the conductive layer such that the 2D Dirac source material layer and the conductive layer may remain in the first recess DCH.

Figure 19:
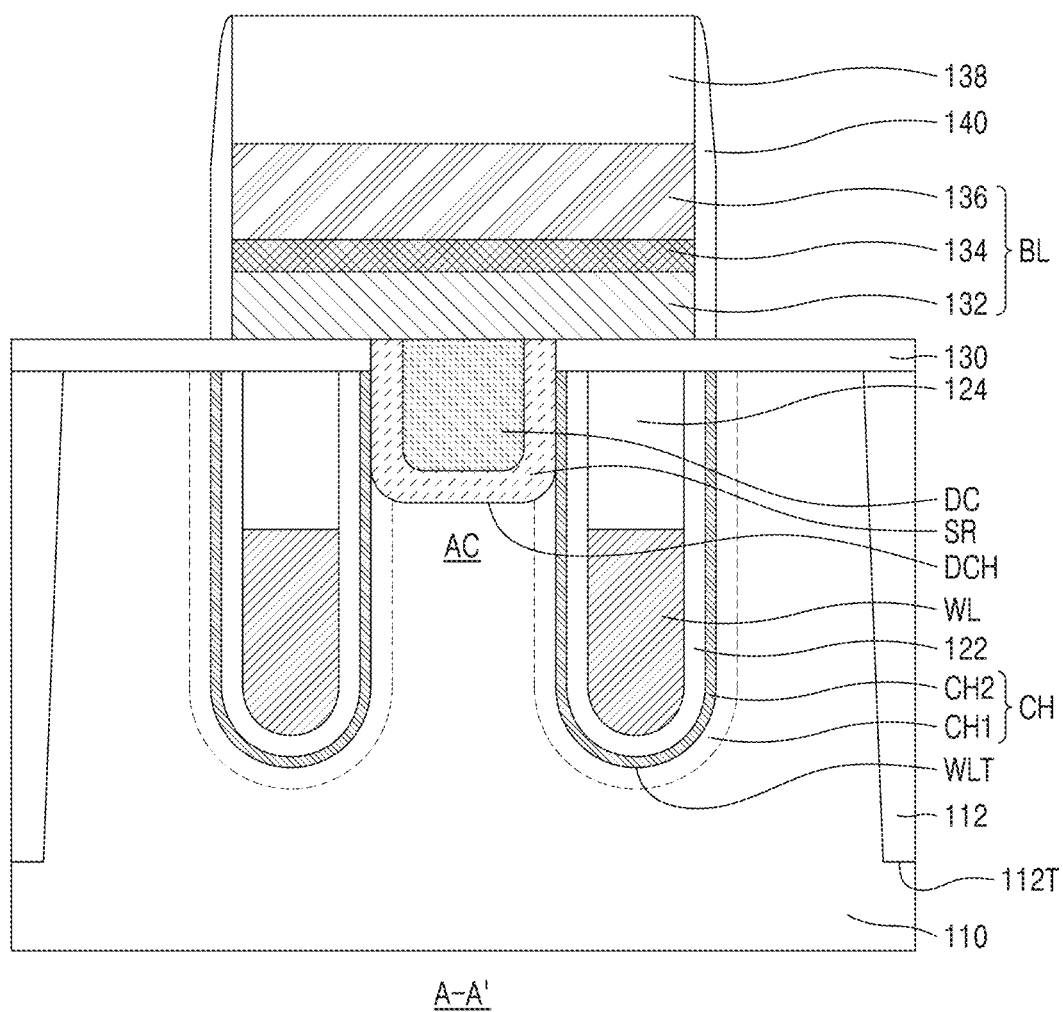

Referring to FIG. 19, a lower conductive layer 132, an intermediate conductive layer 134, and an upper conductive layer 136 may be sequentially formed on the direct contact DC and the first insulating layer 130.

In some example embodiments, the lower conductive layer 132 may include Si, Ge, W, WN, Co, Ni, Al, Mo, Ru, Ti, TiN, Ta, TaN, Cu, or a combination thereof. For example, the lower conductive layer 132 may include polysilicon. The intermediate conductive layer 134 and the upper conductive layer 136 may each include TiN, TiSiN, W, tungsten silicide, or a combination thereof. In some example embodiments, the intermediate conductive layer 134 may be formed of TiN, TiSiN, or a combination thereof, and the upper conductive layer 136 may include W.

Thereafter, an insulating layer (not shown) may be formed on the upper conductive layer 136 and patterned to form a plurality of bit line capping layers 138 extending in the second direction Y. The plurality of bit line capping layers 138 may include a silicon nitride film.

Thereafter, the upper conductive layer 136, the intermediate conductive layer 134, and the lower conductive layer 132 may be patterned using the plurality of bit line capping layers 138 as an etch mask. Accordingly, a plurality of bit lines BL including the lower conductive layer 132, the intermediate conductive layer 134, and the upper conductive layer 136 are obtained.

Thereafter, an insulating layer (not shown) may be formed conformally on side walls and an upper side of the plurality of bit lines BL and anisotropic etching may be performed on the insulating layer such that bit line spacers 140 may remain on the side walls of the plurality of bit lines BL. In some example embodiments, the bit line spacers 140 may be formed of a silicon nitride.

Figure 20:
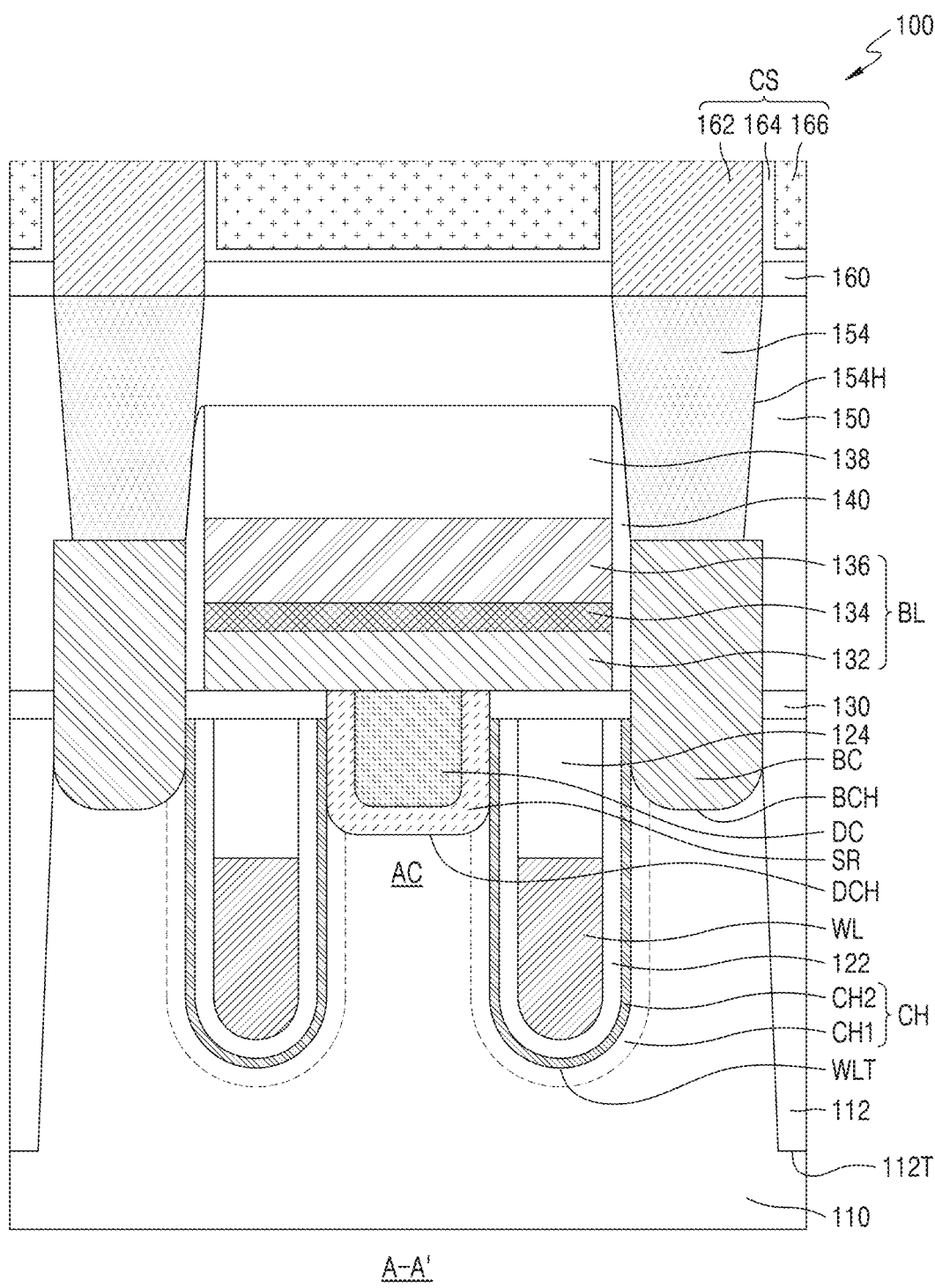

Referring to FIG. 20, a second insulating layer 150 covering the plurality of bit lines BL may be formed. The second insulating layer 150 may include at least one among $SiO_2$, SiOCH, SiOC, SiN, and SiON.

Thereafter, a portion of the second insulating layer 150 and a portion of the first insulating layer 130 are removed to form a plurality of second recesses BCH for exposing the active region AC of the substrate 110 between the plurality of bit lines BL.

Thereafter, a plurality of drain regions BC filling the plurality of second recesses BCH are formed. In some example embodiments, the plurality of drain region BC may include silicon doped with impurities.

Thereafter, a plurality of landing pads 154 may be formed on the plurality of drain regions BC, and a capacitor structure CS including a lower electrode 162, a capacitor dielectric layer 164, and an upper electrode 166 may be formed on the plurality of landing pads 154.

The integrated circuit device 100 is completed according to the above-described manufacturing method.

While the inventive concepts have been particularly shown and described with reference to some example embodiments thereof, it will be understood that various changes in form and details may be made therein without departing from the spirit and scope of the following claims.

What is claimed is:

1. An integrated circuit device comprising:
    a substrate including a word line trench and a first recess adjacent to a first side wall portion of an inner wall of the word line trench;
    a channel region on the inner wall of the word line trench, the channel region extending in a first direction parallel to an upper surface of the substrate, the channel region including a first channel region and a second channel region, the first channel region being in a portion of the substrate that is adjacent to the inner wall of the word line trench, the second channel region being on the inner wall of the word line trench and including a two-dimensional (2D) material of a first conductivity type;
    a gate insulating layer on the second channel region;
    a word line on the gate insulating layer and inside the word line trench; and
    a source region in the first recess and including the 2D material of the first conductivity type.

2. The integrated circuit device of claim 1, wherein the 2D material comprises a Dirac source material.

3. The integrated circuit device of claim 1, wherein the 2D material comprises at least one among Pmmn boron, graphene, S-graphene, α-graphyne, 6, 6, 12-graphyne, 14, 14, 18-graphyne, square carbon, silicene, germanene, Co on Cu (111), $(VO_2)_3/(TiO_2)_5$, square octagon (so)-$MoS_2$, and $Pb_2(C_6H_4)_3$.

4. The integrated circuit device of claim 1, wherein the second channel region is conformally on the inner wall of the word line trench, is in contact with the source region, and comprises a monolayer of the 2D material.

5. The integrated circuit device of claim 1, wherein
the first channel region has a first thickness in a second direction parallel to the upper surface of the substrate and perpendicular to the first direction, and
the second channel region has a second thickness less than the first thickness in the second direction,
the first thickness is in a range of 1 to 20 nm, and
the second thickness is in a range of 1 to 30 Å.

6. The integrated circuit device of claim 1, further comprising:
a bit line on the source region and extending in a second direction parallel to the upper surface of the substrate and perpendicular to the first direction; and
a drain region in a second recess in the substrate, the second recess being adjacent to a second side wall portion of the inner wall of the word line trench, the second side wall portion being opposite to the first side wall portion.

7. The integrated circuit device of claim 6, wherein
the second channel region extends on the inner wall of the word line trench from the first side wall portion to the second side wall portion,
a top of the second channel region on the second side wall portion is at a level higher than a bottom of the drain region, and
the second channel region is in contact with the drain region.

8. The integrated circuit device of claim 6, wherein
the second channel region extends on the inner wall of the word line trench from the first side wall portion to the second side wall portion,
a top of the second channel region on the second side wall portion is at a level lower than a bottom of the drain region, and
the second channel region is not in contact with the drain region.

9. The integrated circuit device of claim 6, wherein
the first channel region comprises silicon of a second conductivity type, and
the drain region comprises silicon of the first conductivity type.

10. The integrated circuit device of claim 6, wherein the drain region comprises the 2D material of the first conductivity type.

11. An integrated circuit device comprising:
a substrate including a word line trench and a first recess adjacent to a first side wall portion of an inner wall of the word line trench;
a channel region on the inner wall of the word line trench and extending in a first direction parallel to an upper surface of the substrate, the channel region including a two-dimensional (2D) material of a first conductivity type;
a gate insulating layer on the channel region;
a word line on the gate insulating layer and inside the word line trench; and
a source region in the first recess, including the 2D material of the first conductivity type, and connected to the channel region.

12. The integrated circuit device of claim 11, wherein the channel region comprises:
a first channel region in a portion of the substrate that is adjacent to the inner wall of the word line trench; and
a second channel region on the inner wall of the word line trench and including the 2D material of the first conductivity type.

13. The integrated circuit device of claim 12, wherein
the first channel region has a first thickness in a second direction, the second direction being parallel to the upper surface of the substrate and perpendicular to the first direction, and
the second channel region has a second thickness less than the first thickness in the second direction,
the first thickness is in a range of 1 to 20 nm, and
the second thickness is in a range of 1 to 30 Å.

14. The integrated circuit device of claim 12, wherein the 2D material comprises a Dirac source material that includes at least one among Pmmn boron, graphene, S-graphene, α-graphyne, 6, 6, 12-graphyne, 14, 14, 18-graphyne, square carbon, silicene, germanene, Co on Cu (111), $(VO_2)_3/(TiO_2)_5$, square octagon (so)-$MoS_2$, and $Pb_2(C_6H_4)_3$.

15. The integrated circuit device of claim 12, further comprising:
a bit line on the source region and extending in a second direction, the second direction being parallel to the upper surface of the substrate and perpendicular to the first direction; and
a drain region in a second recess in the substrate, the second recess being adjacent to a second side wall portion of the inner wall of the word line trench, the second side wall portion being opposite to the first side wall portion.

16. The integrated circuit device of claim 15, wherein
the second channel region extends along the inner wall of the word line trench to the second side wall portion from the first side wall portion,
a top of the second channel region on the second side wall portion is at a level higher than a bottom of the drain region, and
the second channel region is in contact with the drain region.

17. An integrated circuit device comprising:
a substrate including a word line trench, a first recess adjacent to a first side wall portion of an inner wall of the word line trench, and a second recess adjacent to a second side wall portion of the word line trench, the second side wall portion being opposite to the first side wall portion;
a channel region on the inner wall of the word line trench and extending in a first direction parallel to an upper surface of the substrate, the channel region including a first channel region and a second channel region, the first channel region being in a portion of the substrate that is adjacent to the inner wall of the word line trench, the second channel region being on the inner wall of the word line trench and including a two-dimensional (2D) material of a first conductivity type;
a word line on the inner wall of the word line trench and extending in the first direction;
a source region in the first recess and including a two-dimensional (2D) material of the first conductivity type;
a bit line on the source region and extending in a second direction parallel to the upper surface of the substrate and perpendicular to the first direction; and
a drain region in the second recess.

18. The integrated circuit device of claim 17, wherein
the second channel region extends on the inner wall of the word line trench from the first side wall portion to the second side wall portion, and a top of the second channel region at the second side wall portion is at a level higher than a bottom of the drain region.

19. The integrated circuit device of claim 17, wherein
the second channel region is in contact with the source region at the first side wall portion, and
the second channel region is in contact with the drain region at the second side wall portion.

20. The integrated circuit device of claim 17, wherein
the channel region comprises a Dirac source material, and
the channel region comprises a monolayer of the 2D material.

* * * * *